US010262835B2

(12) United States Patent
Nishio

(10) Patent No.: US 10,262,835 B2
(45) Date of Patent: Apr. 16, 2019

(54) PLASMA PROCESSING EQUIPMENT AND PLASMA GENERATION EQUIPMENT

(71) Applicant: HITACHI HIGH-TECHNOLOGIES CORPORATION, Tokyo (JP)

(72) Inventor: Ryoji Nishio, Yamaguchi (JP)

(73) Assignee: HITACHI HIGH-TECHNOLOGIES CORPORATION, Tokyo (JP)

(*) Notice: Subject to any disclaimer, the term of this patent is extended or adjusted under 35 U.S.C. 154(b) by 323 days.

(21) Appl. No.: 15/392,060

(22) Filed: Dec. 28, 2016

(65) Prior Publication Data

US 2017/0110289 A1 Apr. 20, 2017

Related U.S. Application Data

(63) Continuation of application No. 13/144,299, filed as application No. PCT/JP2009/050428 on Jan. 15, 2009, now abandoned.

(51) Int. Cl.
 *H01J 37/32* (2006.01)
(52) U.S. Cl.
 CPC ......... *H01J 37/3211* (2013.01); *H01J 37/321* (2013.01); *H01J 37/3266* (2013.01); *H01J 37/32137* (2013.01); *H01J 37/32651* (2013.01); *H01J 2237/334* (2013.01)
(58) Field of Classification Search
 CPC .................................................. H01J 37/3211
 USPC .......................................................... 216/58
 See application file for complete search history.

(56) References Cited

U.S. PATENT DOCUMENTS 5,215,619 A 6/1993 Cheng et al.
5,567,268 A 10/1996 Kadomura
5,637,961 A 6/1997 Ishii et al.
6,518,705 B2 2/2003 Wilcoxson et al.
6,653,988 B2 11/2003 Kwon et al.
6,805,770 B1 10/2004 Oster
(Continued)

FOREIGN PATENT DOCUMENTS

JP 05-335277 12/1993
JP 06-037048 2/1994
(Continued)

OTHER PUBLICATIONS

Office Action for corresponding Korean Patent Application No. 10-2013-7005536, dated Jun. 10, 2014.
(Continued)

*Primary Examiner* — Roberts P Culbert
(74) *Attorney, Agent, or Firm* — Baker Botts L.L.P.

(57) ABSTRACT

A plasma processing equipment includes a vacuum processing chamber, an insulating material, a gas inlet, a high frequency induction antenna provided at an upper outside of the vacuum processing chamber, a magnetic field coil, a yoke for controlling distribution of a magnetic field in the vacuum processing chamber, a high frequency power supply for generating plasma and supplying a high frequency current to the antenna, and a power supply for supplying power to the magnetic field coil. The antenna is divided into n high frequency induction antenna elements are arranged in tandem on one circle so that a high frequency current delayed sequentially by λ (wavelength of high frequency power supply)/n flows clockwise through the antenna elements arranged in tandem via a delay unit, and a magnetic field is applied from the magnetic field coil to generate electron cyclotron resonance (ECR) phenomenon.

12 Claims, 12 Drawing Sheets

(56) References Cited

U.S. PATENT DOCUMENTS

| | | |
|---|---|---|
| 2003/0102083 A1 | 6/2003 | Sasaki et al. |
| 2003/0218427 A1 | 11/2003 | Hoffman et al. |
| 2004/0040662 A1 | 3/2004 | Edamura et al. |
| 2004/0178151 A1 | 9/2004 | Freeman et al. |
| 2005/0263389 A1 | 12/2005 | Gung et al. |
| 2006/0049138 A1 | 3/2006 | Miyake et al. |

FOREIGN PATENT DOCUMENTS

| | | |
|---|---|---|
| JP | 6-89879 | 3/1994 |
| JP | 07-122397 | 5/1995 |
| JP | 07-161489 | 6/1995 |
| JP | 8-64394 | 3/1996 |
| JP | 08-083696 | 3/1996 |
| JP | 08-203873 | 8/1996 |
| JP | 08-321490 | 12/1996 |
| JP | 08-337887 | 12/1996 |
| JP | 09-024473 | 1/1997 |
| JP | 9-503350 | 3/1997 |
| JP | 09-321031 | 12/1997 |
| JP | 10-64697 A | 3/1998 |
| JP | 10-303468 | 11/1998 |
| JP | 11-172436 | 6/1999 |
| JP | 2000-235900 | 8/2000 |
| JP | 2002-158209 | 5/2002 |
| JP | 2004-79557 | 3/2004 |
| JP | 2004-273458 | 9/2004 |
| JP | 2004-356430 | 12/2004 |
| JP | 2004-537830 | 12/2004 |
| JP | 2005-045231 | 2/2005 |
| JP | 2005-079416 | 3/2005 |
| JP | 2005-203444 | 7/2005 |
| JP | 2005-303053 | 10/2005 |
| JP | 2006-524422 | 10/2006 |
| KR | 10-2004-0019608 | 3/2004 |
| TW | I278907 | 4/2007 |
| WO | WO 95/32315 | 11/1995 |
| WO | WO 2004/095626 A2 | 11/2004 |

OTHER PUBLICATIONS

L. Sansonnens, Electromagnetic field nonuniformities in large area, high-frequency capacitive plasma reactors, including electrode asymmetry effects, Plasma Sources Science and Technology 15 (2006), pp. 302-313.

J. Hopwood et al., Electromagnetic fields in a radio-frequency induction plasma, J. Vac. Sci. Technol. A, Jan./Feb. 1993, pp. 147-151, vol. 11, No. 1.

Office Action in corresponding Korean Patent Application No. 10-2011-0074137, dated Mar. 4, 2014.

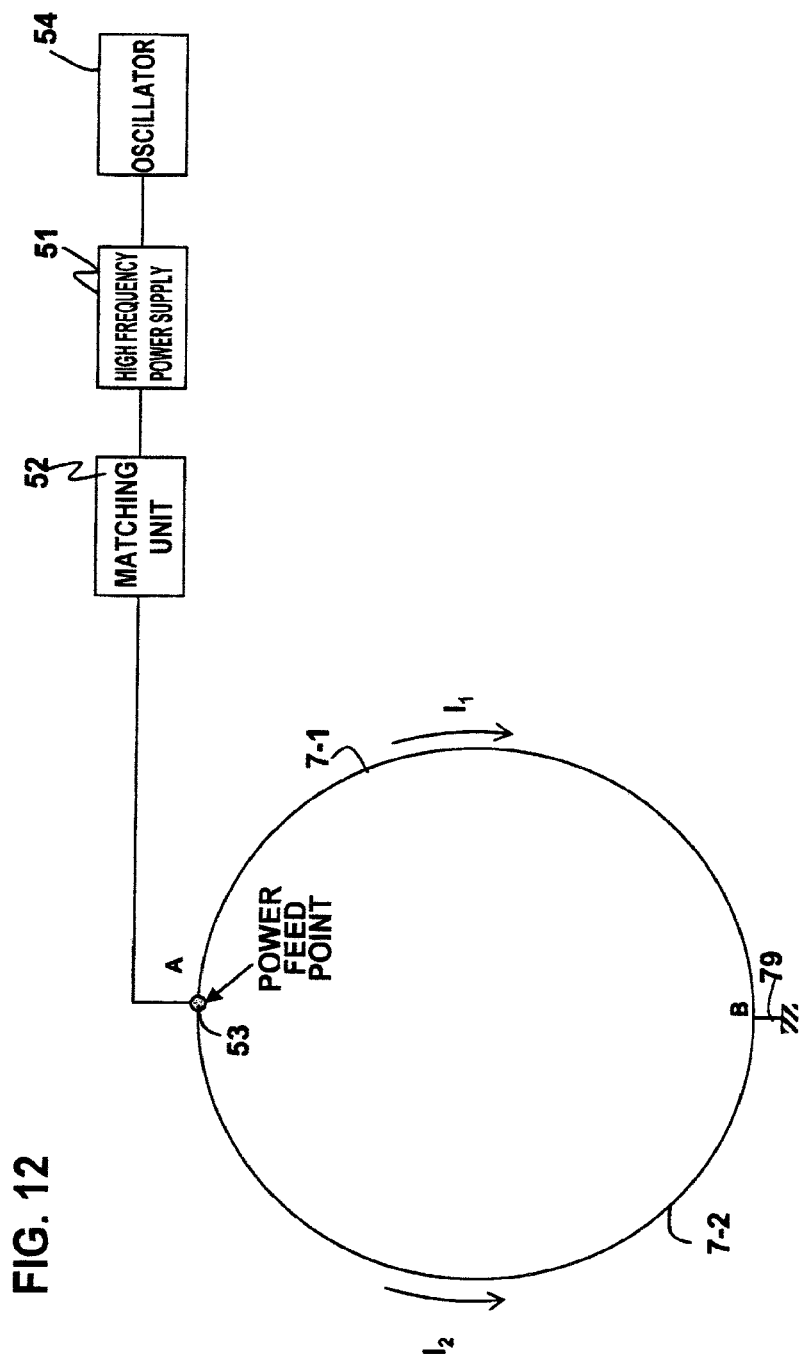

PLASMA PROCESSING EQUIPMENT AND PLASMA GENERATION EQUIPMENT

CROSS REFERENCE TO PRIOR APPLICATIONS

This application is a continuation of U.S. patent application Ser. No. 13/144,299, filed on Jul. 13, 2011, which is a U.S. National Phase application under 35 U.S.C. §371 of International Application No. PCT/JP2009/050428, filed on Jan. 15, 2009. The International application was published in Japanese on Jul. 22, 2010 as WO 2010/082327 A1 under PCT Article 21(2). The contents of the above applications are hereby incorporated by reference.

TECHNICAL FIELD

The present invention relates to a plasma processing apparatus using inductively coupled plasma, and more specifically, relates to the structure of a high frequency induction antenna of the plasma processing apparatus, and a plasma generation apparatus.

BACKGROUND ART

Along with the miniaturization of semiconductor devices, process conditions (process window) for realizing a uniform processing result within a wafer plane through plasma processing have become narrower year after year, and therefore, plasma processing apparatuses are required to control the process conditions in a more complete manner. In order to respond to such demands, apparatuses are required to control the distribution of plasma, the dissociation of process gas and the surface reaction within the reactor with extremely high accuracy.

Currently, a typical plasma source used in such plasma processing apparatus is the high frequency inductively coupled plasma source (hereinafter referred to as ICP). In the ICP, at first, high frequency current I flowing through the high frequency induction antenna creates an induction magnetic field H around the antenna, and the induction magnetic field H creates an induction electric field E. At this time, if electrons exist within the space in which plasma is to be generated, the electrons are driven by the induction electric field E, ionizing gas atoms (molecules) and generating ion and electron pairs. The electrons generated in this manner are driven again by the induction electric field E together with the original electrons, by which further ionization is caused. Finally, plasma is generated via avalanche ionization phenomenon. The area in which plasma density is highest is where the induction magnetic field H or the induction electric field E is strongest within the space in which plasma is generated, that is, the area closest to the antenna. Further, the intensity of the induction magnetic field H and the induction electric field E attenuates by double the distance from the line of current I flowing through the high frequency induction antenna set as center. Therefore, the intensity distribution of the induction magnetic field H and the induction electric field E, in other words, the plasma distribution, can be controlled via the shape of the antenna.

As described, the ICP generates plasma via the high frequency current I flowing through the high frequency induction antenna. In general, when the number of turns of the high frequency induction antenna is increased, the inductance increases and the current drops, but the voltage increases. In contrast, when the number of turns is reduced, the voltage drops but the current increases. In designing the ICP, the preferable level of current and voltage is determined by various reasons, not only from the viewpoint of uniformity, stability and generation efficiency of plasma, but also from the viewpoint of mechanical and electrical engineering. For example, the increase of current causes problems such as heat generation, power loss caused thereby, and current-resisting property of the variable capacitor used in the matching circuit. On the other hand, the increase of voltage causes problems such as abnormal discharge, the influence of capacitive coupling of the high frequency induction antenna and plasma, and the voltage resisting property of the variable capacitor. Therefore, the designers of ICP must determine the shape and the number of turns of the high frequency induction antenna considering issues such as the current resisting property and the voltage resisting property of electric elements such as the variable capacitor used in the matching circuit, the cooling of the high frequency induction antenna and the problem of abnormal discharge.

The ICP is advantageous in that the intensity distribution of the induction magnetic field H and the induction electric field E created by the antenna, that is, the distribution of plasma, can be controlled by the winding method or the shape of the high frequency induction antenna. Based thereon, ICPs have been devised in various ways.

One actual example is a plasma processing apparatus for processing a substrate on a substrate electrode using ICP. An example of such plasma processing apparatus is proposed, wherein a portion or all of the high frequency induction antenna is multi-spiral shaped, realizing a more uniform plasma, reducing the deterioration of electric power efficiency of a matching parallel coil of the matching circuit for the high frequency induction antenna, and minimizing temperature increase (refer for example to patent literature 1).

Another structure has been proposed in which a plurality of identical high frequency induction antennas are respectively disposed in parallel at given angles. One example proposes disposing three lines of high frequency induction antennas at 120° intervals, so as to improve the circumferential uniformity (refer for example to patent literature 2). The high frequency induction antenna can be wound vertically, wound on a plane, or wound around a dome. If a plurality of identical antenna elements are connected in parallel in a circuit-like manner as disclosed in patent literature 2, the total inductance of the high frequency induction antenna composed of multiple antenna elements can be reduced advantageously.

Another example proposes connecting two or more identically shaped antenna elements in parallel in a circuit-like manner to form the high frequency induction antenna, wherein the antenna elements are arranged either concentrically or radially so that the center of the antenna elements corresponds to the center of the object to be processed, the input ends of the respective antenna elements are arranged at angular intervals determined by dividing 360° by the number of antenna elements, and the antenna elements are formed to have a three-dimensional structure in the radial direction and the height direction (refer for example to patent literature 3).

In contrast to the ICP, an electron cyclotron resonance (hereinafter referred to as ECR) plasma source is a plasma generating device utilizing the resonance absorption of electromagnetic waves by electrons, which has superior characteristics in that the absorption efficiency of electromagnetic energy is high, the plasma igniting property is high, and a high density plasma can be obtained. Currently provided plasma sources utilize microwaves (2.45 GHz) or electromagnetic waves of the UHF and VHF bands. In order to radiate electromagnetic waves into the discharge space, electrodeless discharge using waveguides is mainly used for microwaves (2.45 GHz), whereas parallel plate-type capacitive coupling discharge using capacitive coupling between the electrode radiating electromagnetic waves and plasma is mainly used for UHF and VHF.

There is another plasma source that utilizes an ECR phenomenon using a high frequency induction antenna. According to this example, plasma is generated using waves accompanying a kind of ECR phenomenon called whistler waves. Whistler waves are also called helicon waves, and a plasma source utilizing this phenomenon is also called a helicon plasma source. According to the arrangement of the helicon plasma source, for example, a high frequency induction antenna is wound around the side wall of a cylindrical vacuum chamber, a high frequency power having a relatively low frequency, such as 13.56 MHz, is applied, and a magnetic field is further applied thereto. At this time, the high frequency induction antenna generates electrons rotating in the clockwise direction for half a cycle of 13.56 MHz and that rotate in the counterclockwise direction for the remaining half cycle of 13.56 MHz. Out of these two types of electrons, the mutual interaction between the electrons rotating in the clockwise direction and the magnetic field causes the ECR phenomenon. However, the helicon plasma source has various problems and is not suitable for industrial application, since the time in which ECR phenomenon is caused is limited to half a cycle of the high frequency, the location in which ECR is caused is dispersed and the absorption length of electromagnetic wave is long so that a long cylindrical vacuum chamber is required and plasma uniformity is difficult to achieve, and plasma characteristics (such as the electron temperature and gas dissociation) cannot be controlled appropriately since the plasma characteristics changes in steps.

[Patent Literature 1] Japanese Patent Application Laid-Open Publication No. 8-83696
[Patent Literature 2] Japanese Patent Application Laid-Open Publication No. 8-321490
[Patent Literature 3] Japanese Patent Application Laid-Open Publication No. 2005-303053
[Non Patent Literature 1] L. Sansonnens et al., Plasma Sources Sci. Technol. 15, 2006, pp 302
[Non Patent Literature 2] J. Hoopwood et al., J. Vac. Sci. Technol., A11, 1993, pp 147

SUMMARY OF INVENTION

Technical Problem

In an ICP, while the high frequency current I circulates through the high frequency induction antenna, the current flows via stray capacitance into the plasma or earth, causing loss. This also causes the induction magnetic field H to have a non-uniform distribution in the circumferential direction, and as a result, a phenomenon in which the uniformity of plasma in the circumferential direction is deteriorated becomes significant. This phenomenon is a wavelength shortening phenomenon that appears as a reflection wave effect or a skin effect which is influenced not only by the permittivity but also by the permeability of the space surrounding the high frequency induction antenna. This phenomenon is a common phenomenon that occurs even in normal high frequency transmission cables such as coaxial cables, but since the high frequency induction antenna is either inductively coupled or capacitively coupled with plasma, the wavelength shortening effect appears more significantly. Further, not only with respect to ICP but with respect to common plasma sources such as the ECR plasma source or the parallel plate capacitively coupled plasma source, the traveling waves headed toward the antenna and the interior of the vacuum chamber are superposed with the returning reflected waves, causing standing waves to occur in the antenna radiating high frequency and the space surrounding the same. This is because reflected waves are returned from various areas such as the end of the antenna, the plasma, and the interior of the vacuum chamber having high frequency currents radiated therein. The standing waves also relate greatly to the wavelength shortening effect. Under such conditions, in the case of ICP, if the RF power is set to 13.56 Hz having a wavelength as long as approximately 22 m, standing waves with a wavelength shortening effect occur within the antenna loop when the high frequency induction antenna length exceeds approximately 2.5 m. Therefore, the current distribution within the antenna loop becomes non-uniform, and the plasma density distribution becomes non-uniform.

One problem of the ICP is that the phase or flowing direction of the high frequency current I flowing through the antenna is periodically reversed, and along therewith, the direction of the induction magnetic field H (induction electric field E), that is, the direction in which the electrons are driven, is also reversed. In other words, the electrons are repeatedly temporarily stopped every half cycle of the applied high frequency and accelerated in the opposite direction. In such state, if the avalanche ionization of electrons is insufficient at a certain half cycle of the high frequency, there is a drawback in that plasma having sufficiently high density cannot be obtained when the electrons are temporarily stopped. The reason for this phenomenon is that the generation efficiency of plasma is deteriorated when the electrons are decelerated and temporarily stopped. In general, the ICP has inferior plasma ignition property compared to ECR plasma sources and capacitively coupled parallel plate type plasma sources due to the reason mentioned above. Similarly in helicon plasma sources, the generation efficiency of plasma is deteriorated every half cycle of the high frequency.

As described, ICPs have been devised in various ways to improve the uniformity of plasma, but there is a drawback in that every attempt to devise the ICP leads to complicating the structure of the high frequency induction antenna, making it difficult to apply the ICP to industrial apparatuses. Furthermore, the prior art apparatuses are not intended to significantly improve the plasma ignition while maintaining a superior plasma uniformity, so the problem of inferior plasma ignition has not been solved.

On the other hand, since the ECR plasma source has a short wavelength, a complex electric field distribution is likely to occur within the apparatus, making it difficult to obtain uniform plasma.

Since the wavelength of microwaves (2.45 GHz) is short, the microwaves are propagated within the discharge space via various high-order propagating modes in a large-scale ECR plasma source. Thus, electric fields are collectively formed locally at various portions within the plasma discharge space, and high density plasma is generated at those portions. Further, since the microwaves reflected within the plasma apparatus are overlapped with the electric field distribution of incident microwaves propagated via high-order propagating modes and standing waves occur thereby, electric field distribution within the apparatus may become even more complex. By the above two reasons, it is generally difficult to obtain uniform plasma characteristics within a large-scale apparatus. Further, once such complex electric field distribution is generated, it is actually difficult to control the electric field distribution and to change the electric field distribution to a preferable distribution for processing. Such control requires a change in the apparatus structure so as to prevent the occurrence of high-order propagating modes, or to prevent reflected waves reflected from the apparatus from forming a complex electric field distribution. It is almost impossible to achieve via a single apparatus a structure most suitable for a variety of discharge conditions. Further, a magnetic field as strong as 875 Gauss is required to cause ECR discharge via microwaves (2.45 GHz), but there is a drawback in that the power consumed by the coil for generating such magnetic field or the apparatus structure including the yoke becomes extremely large.

As for the magnetic field intensity, the seriousness of the problem is relieved since a relatively weak magnetic field is necessary for UHF and VHF. However, the problem of standing waves is serious even for UHF and VHF having relatively long wavelengths, which is known to cause problems of non-uniform electric field distribution within the discharge space, and non-uniform plasma density distribution of the generated plasma, which leads to deterioration of the process uniformity. Even now, theoretical and experimental studies are still being performed (for example, refer to non patent literature 1).

As described, with respect to prior art ICP, there were attempts to generate plasma with superior uniformity, but the structure of the antenna became too complex and the plasma ignition was not good. On the other hand, ECR plasma sources have good plasma ignition, but have drawbacks in that the plasma uniformity is deteriorated due to the high-order propagating modes of electromagnetic waves and standing waves.

In consideration of the problems of the prior art mentioned above, the present invention aims at providing a plasma source enabling superior plasma ignition and uniformity even when applied to large scale plasma processing apparatuses.

Solution to Problem

The present invention provides a plasma processing apparatus using ICP, capable of utilizing the ECR discharge phenomenon. According to the present invention, superior uniformity of plasma can be achieved by optimizing the antenna structure with minimum devising, and plasma ignition can be improved significantly.

As a first step for solving the problems mentioned above, the present invention provides a plasma processing apparatus supplying high frequency current to a high frequency induction antenna disposed outside a vacuum processing chamber and applying a magnetic field thereto for generating plasma from a gas supplied to a vacuum processing chamber and subjecting a sample to plasma processing, wherein the high frequency induction antenna is divided into n (an integer of n≥2) high frequency induction antenna elements, the divided respective high frequency induction antenna elements are arranged in tandem on a circle, high frequency current delayed sequentially by λ (wavelength of high frequency power supply)/n flows sequentially delayed in a clockwise direction with respect to a line of magnetic force respectively to the tandomly arranged high frequency induction antenna elements. According to the present arrangement, an induction electric field rotating in a clockwise direction with respect to the line of magnetic force is formed within the plasma generating area, and the electrons in the plasma are rotated in the clockwise direction by the induction electric field, thereby solving the problems mentioned earlier.

A second step for solving the problems of the prior art is to apply a magnetic field B to the clockwise-rotating electrons to cause Larmor motion of the electrons. Larmor motion is a clockwise motion based on E×B drift, and in order for this motion to occur, the induction electric field E mentioned above and the magnetic field B must satisfy a relationship of E×B≠0. The direction of application of the magnetic field B is a direction in which the rotating direction of the induction electric field E becomes clockwise with respect to the line of magnetic force of the magnetic field B. When these conditions are satisfied, the clockwise rotating direction of the induction electric field E and the rotating direction of the Larmor motion correspond. Further, regarding the variation of magnetic field B, the variation frequency $f_B$ of the magnetic field B and a rotational frequency of Larmor motion (electron cyclotron frequency $\omega_c$) must satisfy a relationship of $2\pi f_B \ll \omega_c$. In addition to applying the magnetic field B, the object of the present invention can be achieved by having the electron cyclotron frequency $\omega_c$ of the magnetic field intensity correspond to the rotational frequency f of the rotating induction electric field E to cause an electron cyclotron resonance phenomenon.

In order to solve the problems mentioned above, the present invention provides a plasma processing apparatus comprising a vacuum reactor composing a vacuum processing chamber for storing a sample, a gas inlet for introducing a processing gas into the vacuum processing chamber, a high frequency induction antenna disposed outside the vacuum processing chamber, a magnetic field coil for forming a magnetic field in the vacuum processing chamber, a high frequency power supply for generating plasma supplying a high frequency current to the high frequency induction antenna, and a power supply for supplying power to the magnetic field coil, the high frequency power supply supplying high frequency current to the high frequency induction antenna for generating plasma from the gas supplied to the vacuum processing chamber to subject the sample to plasma processing, wherein the high frequency induction antenna is divided into n (an integer of n≥2) high frequency induction antenna elements, the divided respective high frequency induction antenna elements are arranged in tandem on a circle, high frequency current delayed sequentially by λ (wavelength of high frequency power supply)/n flows respectively to the tandomly arranged high frequency induction antenna elements, and a magnetic field is formed by supplying power to the magnetic field coil, to thereby generate plasma for subjecting the sample to plasma processing.

The present invention further provides a plasma processing apparatus comprising a vacuum reactor composing a vacuum processing chamber for storing a sample, a gas inlet for introducing a processing gas into the vacuum processing chamber, a high frequency induction antenna disposed outside the vacuum processing chamber, a magnetic field coil for forming a magnetic field in the vacuum processing chamber, a high frequency power supply for generating plasma supplying a high frequency current to the high frequency induction antenna, and a power supply for supplying power to the magnetic field coil, the high frequency power supply supplying high frequency current to the high frequency induction antenna for generating plasma from the gas supplied to the vacuum processing chamber to subject the sample to plasma processing, wherein the plurality of high frequency induction antennas and the magnetic field are arranged so that the induction electric field E formed by the plurality of antennas and the magnetic field B satisfy a relationship of E×B≠0.

The present invention further provides the plasma processing apparatus comprising a vacuum reactor composing a vacuum processing chamber for storing a sample, a gas inlet for introducing a processing gas into the vacuum processing chamber, a high frequency induction antenna disposed outside the vacuum processing chamber, a magnetic field coil for forming a magnetic field in the vacuum processing chamber, a high frequency power supply for generating plasma supplying a high frequency current to the high frequency induction antenna, and a power supply for supplying power to the magnetic field coil, the high frequency power supply supplying high frequency current to the high frequency induction antenna for generating plasma from the gas supplied to the vacuum processing chamber to subject the sample to plasma processing, wherein a rotational frequency f of the rotating induction electric field E is made to correspond to an electron cyclotron frequency We via the magnetic field B. Thereby, electrons absorb the high frequency power caused by electron cyclotron resonance, and the problems mentioned earlier can be solved.

The present invention further provides the plasma processing apparatus comprising a vacuum reactor composing a vacuum processing chamber for storing a sample, a gas inlet for introducing a processing gas into the vacuum processing chamber, a high frequency induction antenna disposed outside the vacuum processing chamber, a magnetic field coil for forming a magnetic field in the vacuum processing chamber, a high frequency power supply for generating plasma supplying a high frequency current to the high frequency induction antenna, and a power supply for supplying power to the magnetic field coil, the high frequency power supply supplying high frequency current to the high frequency induction antenna for generating plasma from the gas supplied to the vacuum processing chamber to subject the sample to plasma processing, wherein the high frequency induction antenna and the magnetic field are designed so that the direction of rotation of the induction electric field E generated via the antenna rotates in a clockwise direction with respect to the line of magnetic force of the magnetic field B created by the magnetic field coil.

Further, the present invention provides a plasma generation apparatus comprising a vacuum processing chamber and a plurality of high frequency induction antennas through which high frequency flows disposed outside the vacuum processing chamber, wherein an induction electric field distribution formed in the vacuum processing chamber via the plurality of antennas is formed to rotate in a constant direction in a magnetic field having a finite value.

Further, the present invention provides a plasma generation apparatus comprising a vacuum processing chamber and a plurality of high frequency induction antennas through which high frequency flows disposed outside the vacuum processing chamber, wherein the plurality of antennas are arranged axisymmetrically, a magnetic field is distributed axisymmetrically, the axis of the plurality of antennas and the axis of the magnetic field distribution correspond, and the induction electric field distribution formed in the vacuum processing chamber rotates in a constant direction.

According to the present invention, the plasma generation apparatus further characterizes in that a direction of rotation of the induction electric field distribution rotating in the constant direction is clockwise with respect to a direction of a line of magnetic force of the magnetic field.

According further to the plasma generation apparatus of the present invention, the plurality of antennas and the magnetic field are arranged so that the induction electric field E formed via plurality of antennas and the magnetic field B satisfy a relationship of E×B#0.

According further to the plasma generation apparatus of the present invention, a rotational frequency f of the rotating induction electric field E formed via the plurality of antennas is made to correspond to an electron cyclotron frequency via the magnetic field B.

According to the plasma processing apparatus of the present invention, the magnetic field B can be a static magnetic field or a variable magnetic field, wherein if the magnetic field is a variable magnetic field, the variation frequency $f_B$ thereof and a rotational frequency of Larmor motion (electron cyclotron frequency $\omega_c$) should satisfy a relationship of $2\pi f_B \ll \omega_c$ in order to achieve the object of the present invention.

BRIEF DESCRIPTION OF DRAWINGS

FIG. 12 is an explanatory view of the method for supplying power to high frequency induction antenna elements according to the present invention.

REFERENCE SIGNS LIST

Figure 1:
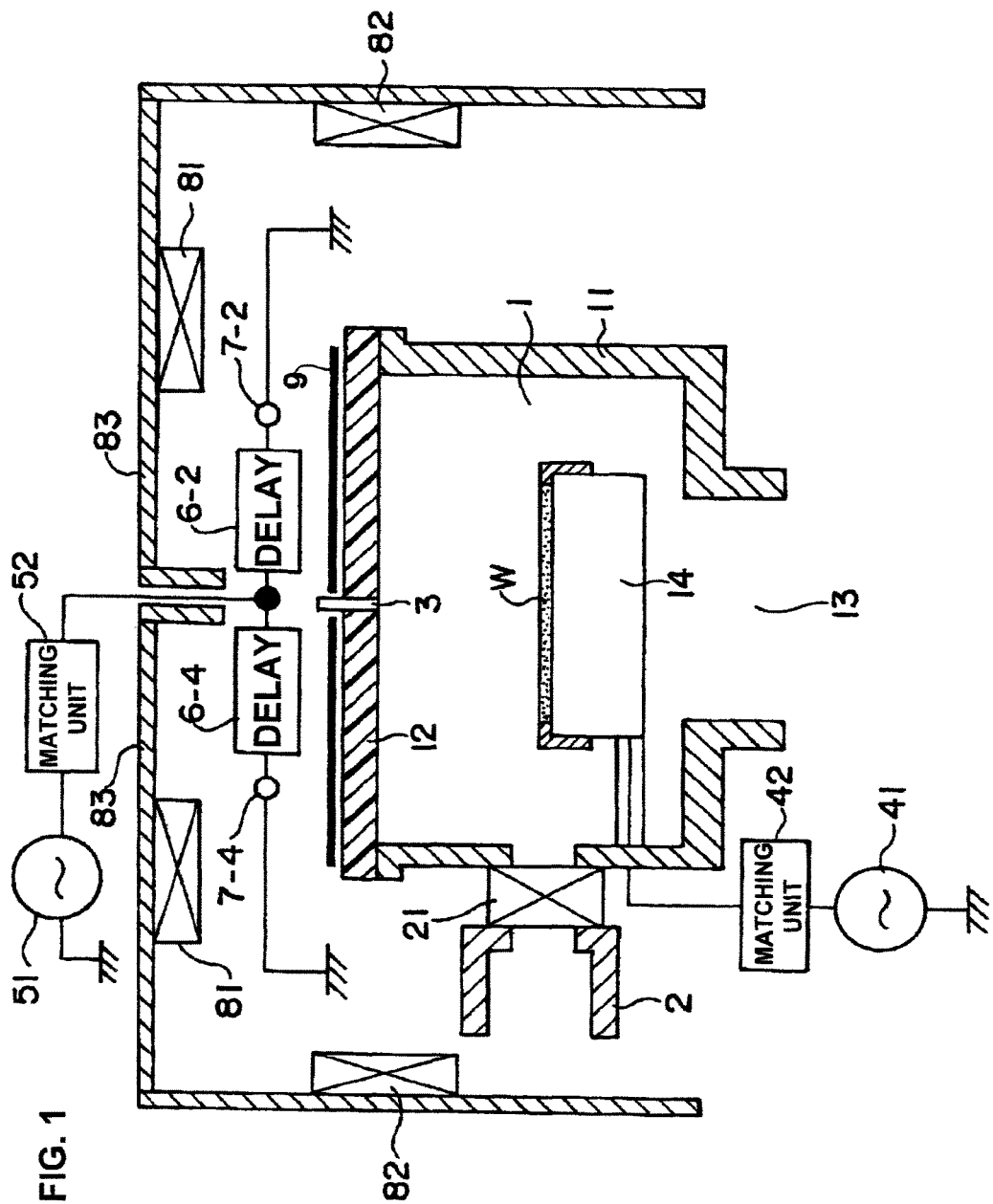
FIG. 1 is a vertical cross-sectional view illustrating the outline of the structure of a plasma processing apparatus to which the present invention is applied.

1 Vacuum processing chamber
11 Vacuum reactor
12 Insulating material
13 Evacuation means
14 Electrode (sample stage)
2 Transfer system 21 Gate valve
3 Gas inlet
41 Biasing high frequency power supply
42 Biasing matching unit
51 High frequency power supply for generating plasma
52 Matching unit for generating plasma
53 Power feed point
54 Oscillator
6 Delay means
7 High frequency induction antenna
7-1 through 7-4 High frequency induction antenna elements
78 Power feed wire
79 Grounding wire
81 Upper magnetic field coil
82 Lower magnetic field coil
93 Yoke
9 Faraday shield
A Power feed end
B Grounded end
W Object to be processed (semiconductor wafer)

DESCRIPTION OF EMBODIMENTS

The application of the plasma processing apparatus according to the present invention is not restricted to the field of semiconductor device fabrication, and can be extended to various fields of plasma processing, such as the fabrication of liquid crystal displays, film deposition and surface treatment of various materials. A plasma etching apparatus for manufacturing semiconductor devices is taken as an example in describing the preferred embodiments of the present invention.

The outline of the structure of the plasma processing apparatus to which the present invention is applied will be described with reference to FIG. 1. A high frequency inductively coupled plasma processing apparatus is composed of a vacuum reactor 11 including a vacuum processing chamber 1 having the inner side thereof maintained in vacuum, an insulating material 12 defining a ceiling of the vacuum processing chamber for introducing an electric field generated via high frequency into the vacuum processing chamber, an evacuation means 13 connected for example to a vacuum pump for maintaining the interior of the vacuum processing chamber 1 in vacuum, an electrode (sample stage) 14 on which an object to be processed (semiconductor wafer) W is placed, a transfer system 2 equipped with a gate valve 21 through which the semiconductor wafer W being the object to be processed is transferred between the vacuum processing chamber and the exterior, a gas inlet 3 for introducing processing gas, a biasing high frequency power supply 41 for applying bias voltage to the semiconductor wafer W, a biasing matching unit 42, a high frequency power supply 51 for generating plasma, a matching unit 52 for generating plasma, a plurality of delay means 6-2, 6-3 (not shown) and 6-4, high frequency induction antenna elements 7-1 (not shown), 7-2, 7-3 (not shown) and 7-4 arranged on an upper circumference of the vacuum processing chamber 1 divided into multiple parts and arranged in tandem on one circle for constituting a high frequency induction antenna 7, an electromagnet constituting an upper antenna 81 and a lower antenna 82 for applying a magnetic field, a yoke 83 formed of a magnetic body for controlling the distribution of the magnetic field, and a Faraday shield 9 for controlling the capacitive coupling of the high frequency induction antenna elements 7-1 (not shown), 7-2, 7-3 (not shown) and 7-4 with plasma.

The vacuum reactor 11 is formed for example of aluminum or stainless steel having the surface thereof subjected to alumite processing, and is electrically grounded. Surface treatments other than alumite processing, such as treatments using other substances having high plasma durability (such as yttria: $Y_2O_3$) can also be applied. The vacuum processing chamber 1 is equipped with an evacuation means 13, and a transfer system 2 including a gate valve 21 for enabling semiconductor wafers as objects to be processed to be carried into and out of the chamber 1. An electrode 14 on which the semiconductor wafer W is placed is disposed in the vacuum processing chamber 1. By the transfer system 2, the wafer W carried into the vacuum processing chamber is placed on the electrode 14. A biasing high frequency power supply 41 is connected to the electrode 14 via a biasing matching unit 42 with the aim to control the energy of ions being incident on the semiconductor wafer W during plasma processing. A gas for the etching process is introduced through a gas inlet 3 into the vacuum processing chamber 1.

On the other hand, high frequency induction antenna elements 7-1 (not shown), 7-2, 7-3 (not shown) and 7-4 are disposed at positions opposed to the semiconductor wafer W on a surface opposed to the semiconductor wafer W on the atmospheric side having intervened therebetween an insulating material such as quartz or alumina ceramic. High frequency induction antenna elements . . . , 7-2, . . . and 7-4 are arranged on a concentric circle having a center corresponding to the center of the semiconductor wafer W. Although not shown clearly in FIG. 1, the high frequency induction antenna elements . . . , 7-2, . . . and 7-4 are composed of multiple antenna elements having an identical shape. Power feed ends A of the multiple antenna elements are connected via a plasma generating matching unit 52 to a high frequency power supply 51 for generating plasma, and grounded ends B thereof are connected to a ground potential in identical manners.

Between the high frequency induction antenna elements . . . , 7-2, . . . and 7-4 and the plasma generating matching unit 52 are disposed delay means 6-2, 6-3 (not shown) and 6-4 for delaying the phases of currents flowing through the respective high frequency induction antenna elements . . . , 7-2, . . . and 7-4.

A refrigerant passage not shown for cooling is formed in the insulating material 12, and the material 12 is cooled by having water, Fluorinert (Registered Trademark), air, nitrogen or other fluids flown therethrough. The antenna, the vacuum reactor 11 and the wafer mounting stage 14 are also cooled or subjected to temperature control.

Example 1

A first example of the plasma processing apparatus according to the present invention will be described with reference to FIG. 2. In the present example, as shown in FIG. 2 (A) taken from the upper side of FIG. 1, the high frequency induction antenna 7 is divided into four (an integer of n≥2) high frequency induction antenna elements 7-1 through 7-4 on one circle. The respective power feed ends A or the grounded ends B of the respective high frequency induction antenna elements 7-1, 7-2, 7-3 and 7-4 are each separated by 360°/4 (360°/n) in the clockwise direction, and high frequency current is supplied from the high frequency power supply 51 for generating plasma via the plasma generating matching unit 52 and through a power feed point 53 and via the respective power feed ends A to the respective high frequency induction antenna elements 7-1, 7-2, 7-3 and 7-4. In the present embodiment, the respective high frequency induction antenna elements 7-1 through 7-4 have their grounded ends B separated by approximately λ/4 from their respective power feed ends A in the clockwise direction around one circle. The lengths of the respective high frequency induction antenna elements 7-1 through 7-4 are not necessary λ/4, but should preferably be equal to or smaller than λ/4 of the generated standing wave. A λ/4 delay circuit 6-2, a λ/2 delay circuit 6-3 and a 3λ/4 delay circuit 6-4 are respectively inserted between the power feed point 53 and the power feed ends A of the high frequency induction antenna elements 7-2, 7-3 and 7-4. According to this arrangement, the currents $I_1$, $I_2$, $I_3$ and $I_4$ flowing through the respective induction antenna elements 7-1 through 7-4 will have phases sequentially delayed by λ/4 (λ/n) as shown in FIG. 2 (B). The electrons in the plasma driven via current $I_1$ will be driven subsequently via current $I_2$. Further, the electrons in the plasma driven via current $I_3$ will be driven subsequently via current $I_4$.

Figure 2:
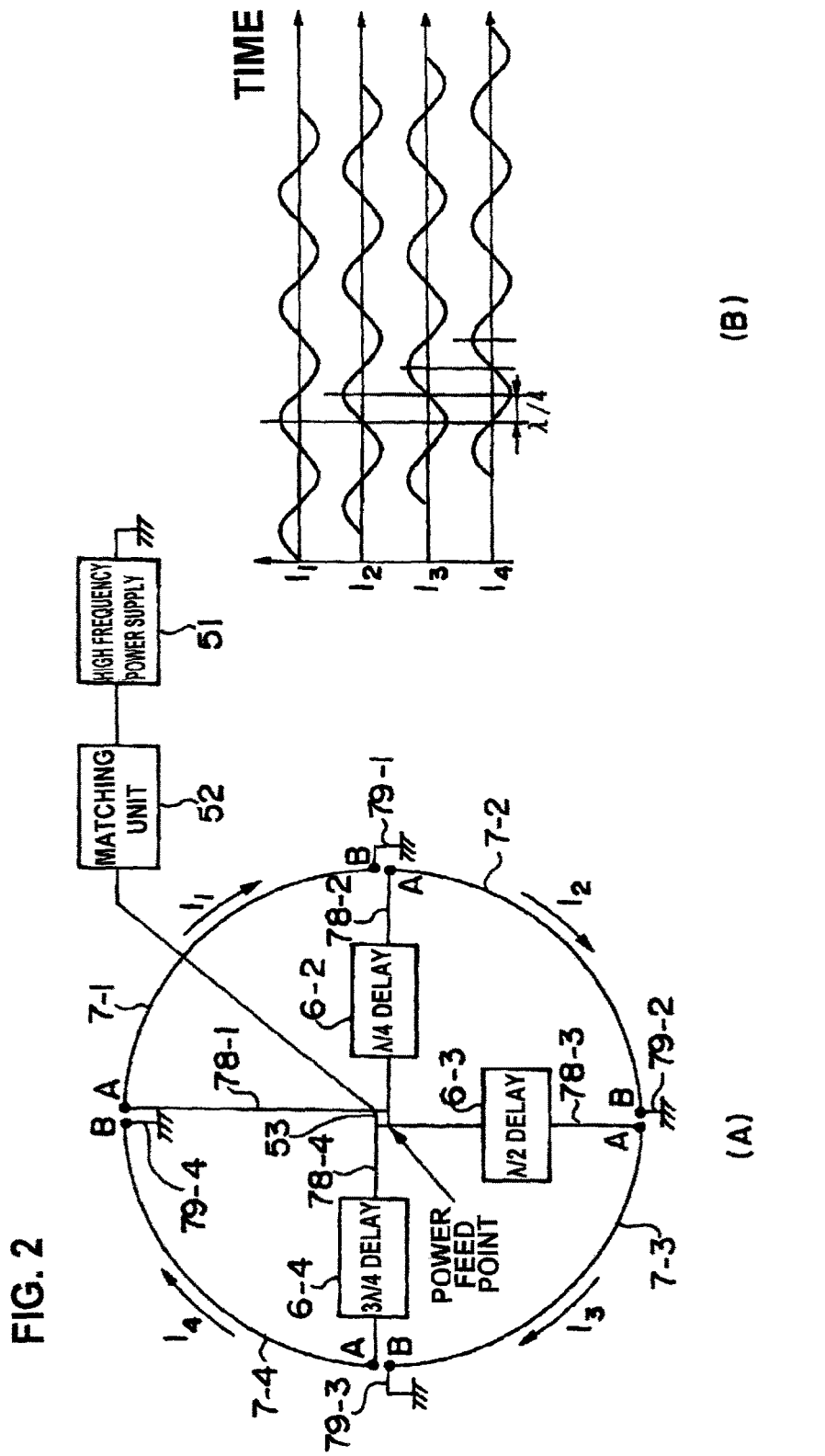
FIG. 2 is an explanatory view of the method for supplying power to high frequency induction antenna elements according to the present invention.
Figure 3:
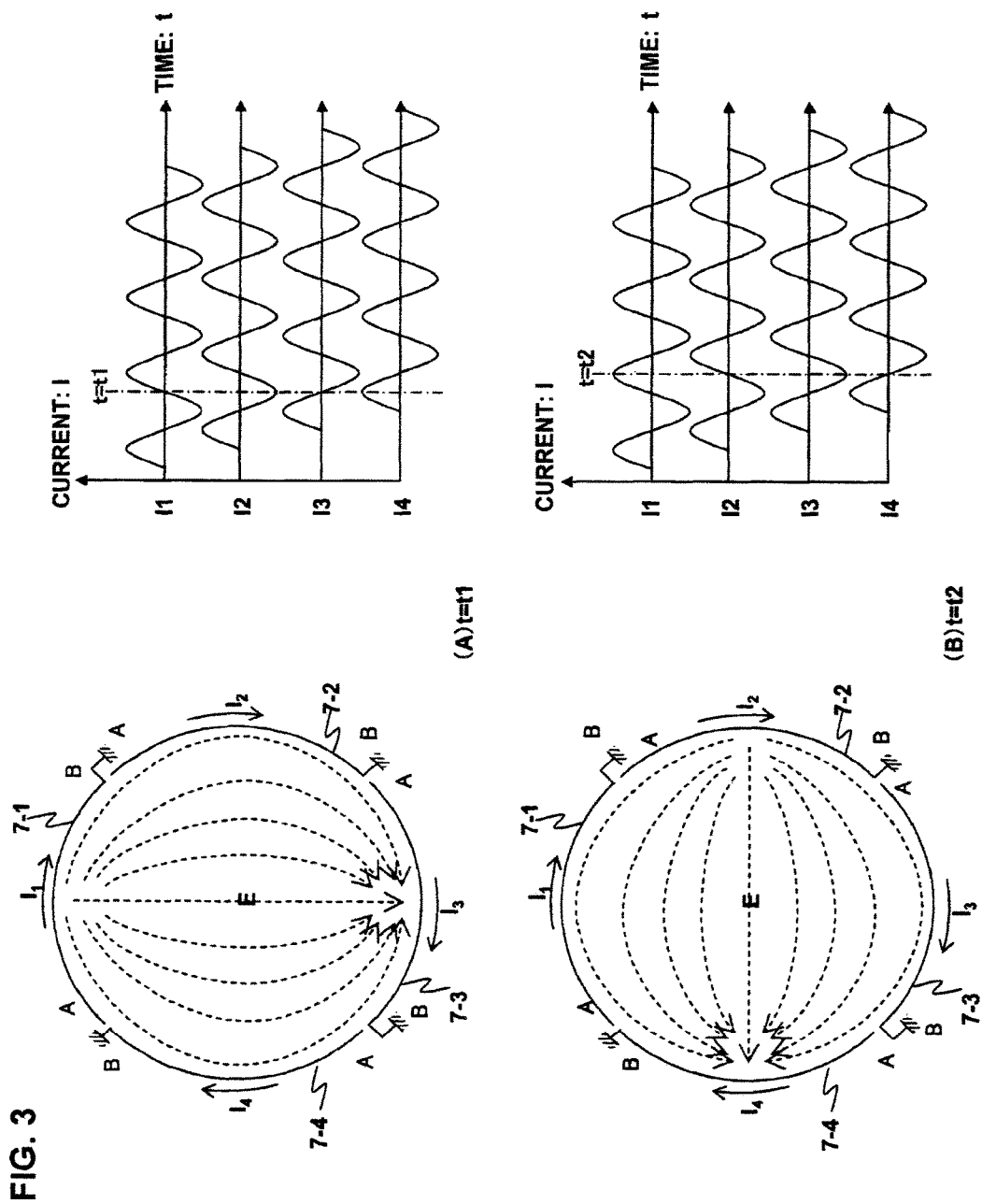
FIG. 3 is an explanatory view of the state of generation of plasma by the state of the electric field according to the present invention.

How electrons in the plasma are driven when high frequency induction antennas shown in FIG. 2 are used will be described with reference to FIG. 3. In FIG. 3, the arrangement of the power feed ends A and grounded ends B of the high frequency induction antenna elements 7-1, 7-2, 7-3 and 7-4 are the same as FIG. 2. Further, the directions of currents $I_1$ through $I_4$ flowing through the respective induction antenna elements are all illustrated to flow from the power feed ends A toward the grounded ends B. The currents flowing through the respective high frequency induction antenna elements have their phases $I_1$ through $I_4$ respectively displaced by 90°, as shown in FIG. 2. The phases are displaced by 90° with the aim to allocate a single cycle (360°) of high frequency current into four high frequency induction antenna elements, and a relationship of 360°/4=90° is satisfied. The current I and the induction electric field E are correlated using induction magnetic field H via Maxwell's equations shown in expressions (1) and (2) below. In the following expressions (1) and (2), E, H and I represent vectors of all the electric field, the magnetic field and the current of the high frequency induction antennas and plasma, μ represents magnetic permeability, and ε represents permittivity.

[Math. 1]

$$\nabla \times E = \mu \frac{\partial H}{\partial t} \quad (1)$$

$$\nabla \times H = \varepsilon \frac{\partial E}{\partial t} + J \quad (2)$$

The relationship of phases of the currents are shown on the right side of FIG. 3 (A). The direction of the induction electric field E during a certain time (t=t1) in the area surrounded by the high frequency induction antenna is shown on the left side of FIG. 3 (A) by dotted lines and arrows. As shown, the distribution of the induction electric field E is axisymmetric. The direction of the induction electric field E when the phase of the currents is advanced by 90° from FIG. 3 (A) (t=t2) is shown in FIG. 3 (B). The direction of the induction electric field E is rotated for 90° in the clockwise direction. As shown in FIG. 3, it s recognized that the high frequency induction antenna according to the present invention creates an induction electric field E that rotates toward the right, that is, in the clockwise direction, with time. When electrons exist within the clockwise-rotating induction electric field E, the electrons are also driven by the induction electric field E to rotate in the clockwise direction. In this case, the rotation period of the electrons corresponds to the frequency of the high frequency current. However, it is possible to create an induction electric field E having a rotation period that varies from the frequency of the high frequency current via technological efforts, and in that case, the electrons rotate not via the same cycle as the high frequency current but via the same cycle as the rotation period of the induction electric field. As described, the electrons are driven via the induction electric field E according to the present invention similar to normal ICPs. However, the present invention varies from normal ICPs or helicon plasma sources in that the electrons are driven in a constant direction (clockwise in the drawing) regardless of the phase of current I of the high frequency induction antenna, and that there is no moment when the rotation is stopped.

Figure 4:
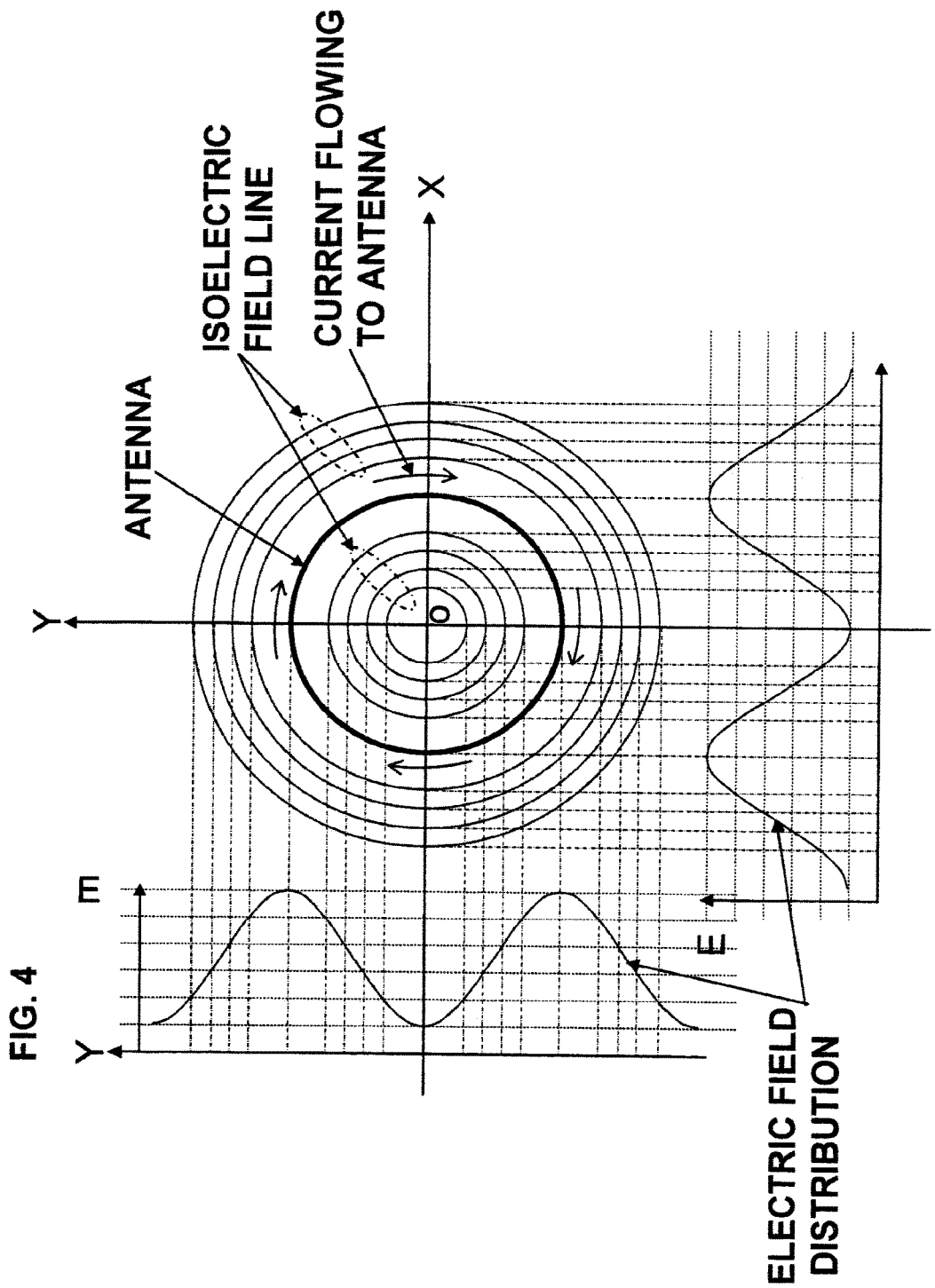
FIG. 4 is an explanatory view showing the distribution of electric field intensity generated by the prior art antenna.

Now, we will describe the induction electric field E generated in the plasma by the high frequency induction antenna according to the present invention. The induction electric field E is described in the following, but as shown in expression (1), the induction electric field E and the induction magnetic field H are mutually convertible physical quantities and are equivalent. First, FIG. 4 illustrates a frame format of the distribution of the induction electric field E created by a prior art ICP. According to the prior art ICP, a current having the same phase is flown through the antenna regardless of whether the antenna forms a single circle or whether the antenna is divided into multiple elements, so the induction electric field E created by the antenna will be the same in the circumferential direction. In other words, a donut-shaped electric field distribution is created in which the induction electric field E has a maximum value appearing immediately below the antenna and is attenuated toward the center and the circumference of the antenna. The distribution is point symmetric with respect to a center point O in the X-Y plane. Theoretically, the induction electric field E at center point O of the antenna is E=0. This donut-shaped electric field distribution rotates in the clockwise direction or the counterclockwise direction according to the direction (half cycle) of the current. The current becomes zero when the direction of rotation of the induction electric field E changes, and the induction electric field E becomes E=0 temporarily in all areas. Such an induction electric field E has been measured and confirmed in the past as induction magnetic field H (refer for example to non patent literature 2).

Figure 5:
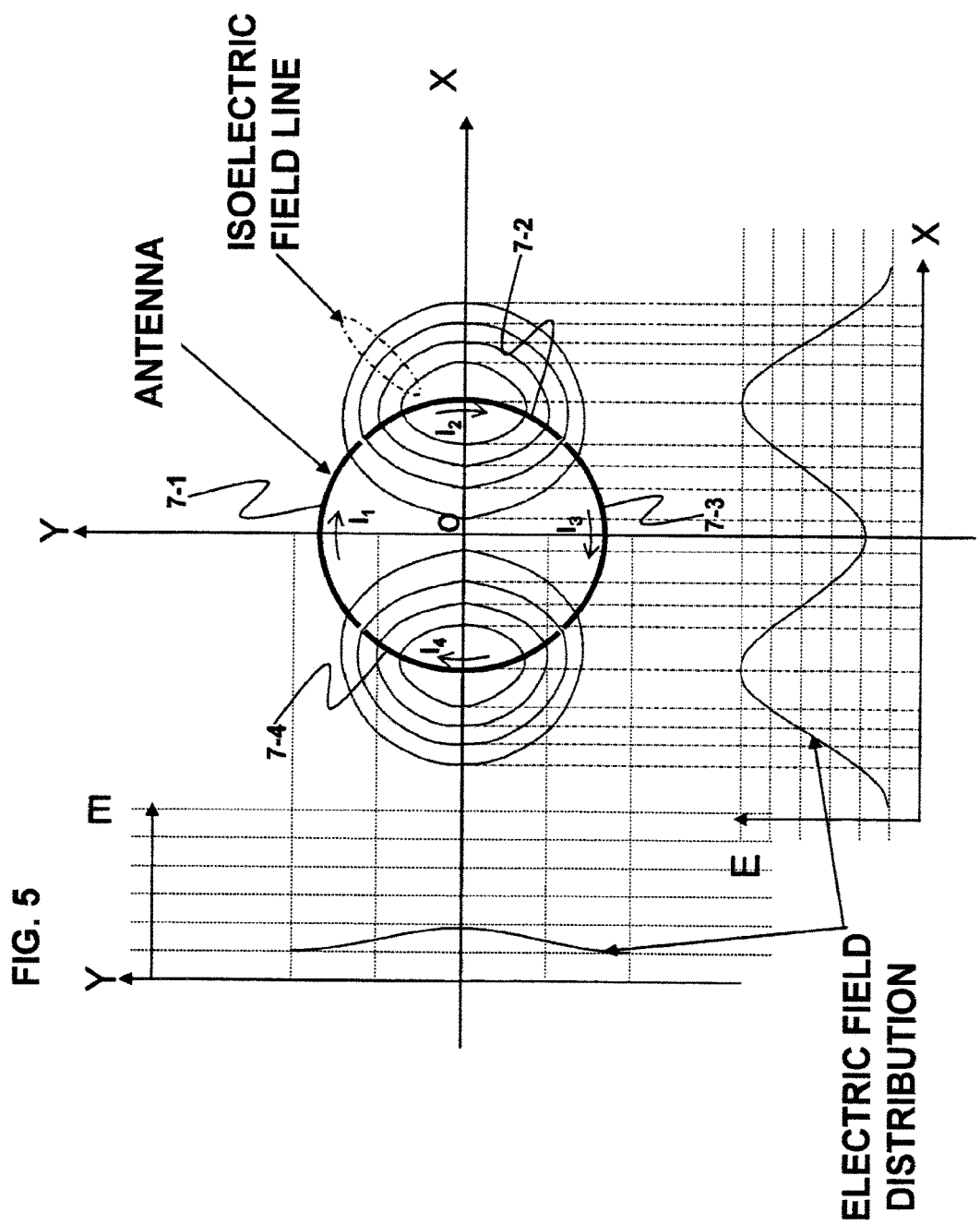
FIG. 5 is an explanatory view of the distribution of electric field intensity generated by the antenna according to the present invention.

Next, we will describe the induction electric field E created by the antenna according to the present invention. First, the current status equal to FIG. 3 (A) will be considered. In other words, a positive peak current flows through $I_4$ and an opposite peak current flows through $I_2$. In contrast, $I_1$ and $I_3$ are small. In this case, the maximum value of the induction electric field E appears below the antenna element 7-4 through which $I_4$ flows and the antenna element 7-2 through which $I_2$ flows. No strong induction electric field E appears below antenna elements 7-1 and 7-3 through which current barely flows. This example is shown in frame format in FIG. 5. The drawing shows two peaks appearing on the X axis in the X-Y plane. As shown in FIG. 5, the induction electric field E according to the present invention has two large peaks on the antenna circle, and is axisymmetric (symmetric with respect to the Y axis) in the X-Y plane. The present distribution has a gentle peak on the Y axis. The height of the gentle peak distribution is low, and the position appears on the center coordinate O. In other words, the induction electric field at center point O of the antenna is not E=0. As described, the arrangement of FIG. 2 of the present invention creates an induction electric field E which is completely different from that created via prior art ICP or helicon plasma source, and which rotates in a constant direction (clockwise in the drawing) regardless of the phase of current I of the high frequency induction antenna. Further, as shown clearly in FIG. 3, there is no moment when all the currents I flowing through all the high frequency induction antenna elements become I=0. Therefore, another characteristic feature of the present invention is that there is no moment when the rotating induction electric field E becomes E=0.

The present invention enables to generate an induction electric field having local peaks as mentioned earlier, but the uniformity of the generated plasma is not deteriorated thereby. First, the induction electric field distribution on the X axis of FIG. 5 is determined by the distribution of the induction magnetic field generated by the antenna. In other words, when the same current is supplied, the induction electric field distribution on the X axis of FIG. 4 and the induction electric field distribution on the X axis of FIG. 5 are equal. Further, since the induction electric field of the present invention rotates via the same frequency as the high frequency current flown through the antenna, the present invention creates a point symmetric induction electric field distribution with respect to center point O on the X-Y plane when averaging a single cycle of the high frequency current. In other words, the present invention creates a completely different induction electric field distribution compared to the prior art, but the advantageous features of the prior art ICP, in which the induction electric field distribution is determined by the structure of the antenna and a point-symmetric and circumferentially uniform plasma is generated, are maintained.

Now, by utilizing the upper and lower magnetic field coils 81 and 82 and the yoke 83 shown in FIG. 1, it becomes possible to apply a magnetic field B having a perpendicular magnetic field component with respect to the rotational plane of the induction electric field E. According to the present invention, there are two conditions that the magnetic field B must satisfy. One condition is that the magnetic field B should be applied so that the direction of rotation of the rotating induction electric field E is constantly clockwise with respect to the direction of the line of magnetic force of the magnetic field B. For example, according to the arrangement of FIG. 2, the induction electric field E rotates in the clockwise direction with respect to the paper plane, that is, in the right direction, as have been described. In that case, the direction of the lines of magnetic force must have components directed from the front side of the plane surface toward the rear side thereof. According to such arrangement, the direction of rotation of the induction electric field E and the direction of rotation of Larmor motion correspond. This first condition can also be expressed as applying a magnetic field B so that the direction of rotation of the induction electric field E corresponds to the direction of rotation of the Larmor motion.

The remaining condition is that a magnetic field B must be applied that satisfies E×B≠O with respect to the induction electric field E. However, this condition of E×B≠O must be satisfied at some portion of the space in which plasma is to be generated but is not necessarily satisfied in all the space in which plasma is to be generated. There are various ways in which the magnetic field is applied, but unless a magnetic field having a locally complex structure is applied, the present condition of E×B≠O is included in the aforementioned first condition. According to the present condition of "E×B≠O", the electrons perform rotational movement called a Larmor motion around the line of magnetic force (guiding center). The Larmor motion is not a rotational movement caused by the rotating induction electric field, but is so-called an electron cyclotron motion. The rotational frequency thereof is called an electron cyclotron frequency $\omega_c$, and can be expressed by the following expression (3). In the following expression (3), q represents the elementary charge of the electrons, B represents the magnetic field intensity, and $m_e$ represents the mass of the electrons. The characteristic feature of the electron cyclotron motion is that the frequency thereof is determined only via the magnetic field intensity.

[Math. 2]

$$\omega_c = \frac{qB}{m_e} \qquad (3)$$

Now, electron cyclotron resonance occurs when the rotational frequency f of the rotating induction electric field E is set to correspond to the cyclotron frequency $\omega_c$, and the high frequency power flowing through the high frequency induction antenna is resonantly absorbed by the electrons, by which high density plasma is generated. However, this condition that "the rotational frequency f of the induction electric field E is set to correspond to the cyclotron frequency $\omega_c$" is only necessarily satisfied at some area in the space in which plasma should be generated but is not necessarily satisfied in all the space in which plasma should be generated. The present conditions for causing ECR is represented by the following expression (4).

[Math. 3]

$$2\pi f = \omega_c \qquad (4)$$

The magnetic field B applied here can either be a static magnetic field or a variable magnetic field. However, in the case of a variable magnetic field, the variation frequency fB must satisfy a relationship of $2\pi f_B \ll \omega_c$ with respect to the rotational frequency (electron cyclotron frequency ω) of the Larmor motion. The meaning of this relationship is that from the view of a single cycle of electrons performing electron cyclotron motion, the variation of the variable magnetic field is sufficiently small and can be regarded as a static magnetic field.

As described, a plasma heating method called electron cyclotron (ECR) heating can be used to significantly improve the plasma generating ability of electrons. However, in the industrial application of the present invention, regarding the method for achieving desired plasma characteristics, it is preferable to optimize the antenna structure to control the intensity and distribution of the induction electric field E and to variably control the intensity distribution of the magnetic field B, so as to create a space in which the necessary areas satisfy the necessary conditions of the magnetic field B and the frequency in order to control the plasma generation and the diffusion thereof. FIG. 1 illustrates one embodiment considering these points.

Further, the method for enabling ECR discharge using a high frequency inductively coupled plasma source as mentioned in the present invention can be applied by constantly satisfying the conditions mentioned earlier, and is not dependent on the frequency of the high frequency being used or the magnetic intensity. Of course, upon engineering application of the present invention, practical restrictions such as the size of the reactor of the plasma being generated create restrictions in the frequency and the magnetic field intensity to be used. For example, if the radius rL of the Larmor motion expressed in the following expression is greater than the reactor in which plasma is confined, the electrons will collide against the reactor wall without moving in circular motion, so that ECR phenomenon will not occur. In expression (5), ν represents the velocity of electrons in the direction horizontal to the plane of the magnetic field shown in FIG. 3.

[Math. 4]

$$rL = \frac{v}{\omega_c} \quad (5)$$

In this case, of course, the frequency of the utilized high frequency must be set high and the magnetic field intensity must also be set high so that ECR phenomenon occurs.

However, the selection of frequency and magnetic field intensity belongs to the field of engineering design, and the principle itself taught in the present invention is not impaired thereby.

The necessary and sufficient conditions of the principle for enabling ECR discharge in an ICP taught in the present invention can be summarized into the following four conditions. The first condition is to create an induction electric field E distribution that is constantly rotating in the clockwise direction with respect to the direction of the line of magnetic force of the magnetic field B applied to the space in which plasma is to be generated. The second condition is to apply a magnetic field B that satisfies E×B≠O with respect to the magnetic field B and the distribution of the clockwise-rotating induction electric field E with respect to the line of magnetic force thereof. The third condition is to have the rotational frequency f of the rotating induction electric field E correspond to the electron cyclotron frequency $\omega_c$ via the magnetic field B. The fourth condition is that the change of the magnetic field B is sufficiently small with respect to a single cycle of electrons in electron cyclotron motion so that the magnetic field B can be regarded as a static magnetic field. FIG. 1 shows an example satisfying the above four conditions, but as long as the above-mentioned necessary and sufficient conditions are satisfied, the example of FIG. 1 can be modified in various ways to still enable ECR discharge via ICP. In other words, one must note that any modification of the apparatus arrangement of FIG. 1 will still be regarded as an example of the present invention as long as the above-mentioned necessary and sufficient conditions are satisfied. Such modifications are merely a matter of engineering design, and they would not alter the physical principle taught by the present invention. Modified examples of FIG. 1 will be describe briefly hereafter.

In FIG. 1, the insulating material 12 has a planar shape, and the high frequency induction antenna 7 is arranged on the upper portion thereof. The meaning of this arrangement is that an induction electric field E having a distribution constantly rotating clockwise with respect to the line of magnetic force of the magnetic field B is created in the space in which plasma should be generated, that is, in the space formed between the insulating material 12 and the wafer W to be processed. This corresponds to the first condition of the above-mentioned necessary and sufficient conditions. Therefore, the planar shape of the insulating material 12 and the arrangement of the high frequency induction antenna 7 disposed above the insulating material 12 are not indispensable arrangements according to the present invention. For example, the insulating material 12 can be a trapezoidal or spherical bell jar, and as long as the contents of the first necessary and sufficient conditions can be realized in the space formed between the bell jar and the wafer W to be processed, the high frequency induction antenna can be arranged at any position with respect to the bell jar. The same stands for the arrangement in which a high frequency induction antenna 7 is arranged on the side of a cylindrical insulating material 12, and as long as the contents of the first necessary and sufficient conditions can be realized in the space formed between the cylindrical insulating material 12 and the wafer W to be processed, the arrangement will constitute an embodiment of the present invention.

In FIG. 1 (FIG. 2), the high frequency induction antenna 7 divided into four parts is arranged on one circle. This arrangement that the antenna elements are arranged "on one circle" is not the necessary condition for realizing the contents of the first necessary and sufficient conditions. For example, the contents of the first necessary and sufficient conditions can be realized even if high frequency induction antenna divided into four parts are arranged in two circles, a large circle and a small circle, or arranged on the inner circumference and the outer circumference, or above and below or obliquely with respect to the planar insulating material 12. In other words, as long as the contents of the first necessary and sufficient conditions is realized, the number of circles or the arrangements can be selected freely. Even if the insulating body is not a planar body but a trapezoidal or spherical bell jar or a cylindrical insulating body 12, the induction antenna elements can be arranged on the inner circumference and the outer circumference, or above and below or obliquely with respect thereto. Further, the antenna divided into multiple parts can be arranged on three or more circles.

In FIG. 1 (FIG. 2), the circular high frequency induction antenna 7 divided into four parts is arranged on one circle. The antenna "divided into four parts" is not an indispensable arrangement for realizing the contents of the first necessary and sufficient conditions. The number into which the high frequency induction antenna is divided is an integer n satisfying n≥2. N numbers of circular arc-shaped antennas can be used to form a single circle of high frequency induction antenna 7. Further, according to FIG. 1, a method for forming an induction electric field E that rotates in the clockwise direction with respect to the direction of the line of magnetic force via phase control of currents flowing to the high frequency, but the electric field can be formed without fail when n≥3. The case of n=2 is special, which means that two semicircular antennas are used to form a single circle, and currents are flown to the two antenna elements with a phase difference of (360°)/(two antennas)=(180°). In that case, it seems that if currents are simply supplied to the elements, the induction electric field E may rotate both in the clockwise and counterclockwise directions, and seems that the contents of the first necessary and sufficient conditions is not satisfied. However, when a magnetic field satisfying the necessary and sufficient conditions of the present invention is applied, the electrons will voluntarily move in the clockwise direction via Larmor motion, and as a result, the induction electric field E will rotate in the clockwise direction. Therefore, the high frequency induction antenna according to the present invention can be divided into an integer n that satisfies n≥2, as mentioned earlier.

In FIG. 1 (FIG. 2), the circular arc-shaped high frequency induction antenna 7 divided into four parts is arranged on one circle. The "arrangement on a circle" is not an indispensable arrangement for realizing the first point of the necessary and sufficient conditions.

For example, four linear antennas arranged in a square can realize the contents of the first necessary and sufficient conditions. Of course, n numbers of linear antennas satisfying n≥2 can be used to constitute a high frequency induction antenna 7 having a polygonal shape with n sides (if n=2, the antennas should be opposed to each other with a certain distance therebetween).

Example 2

Figure 6:
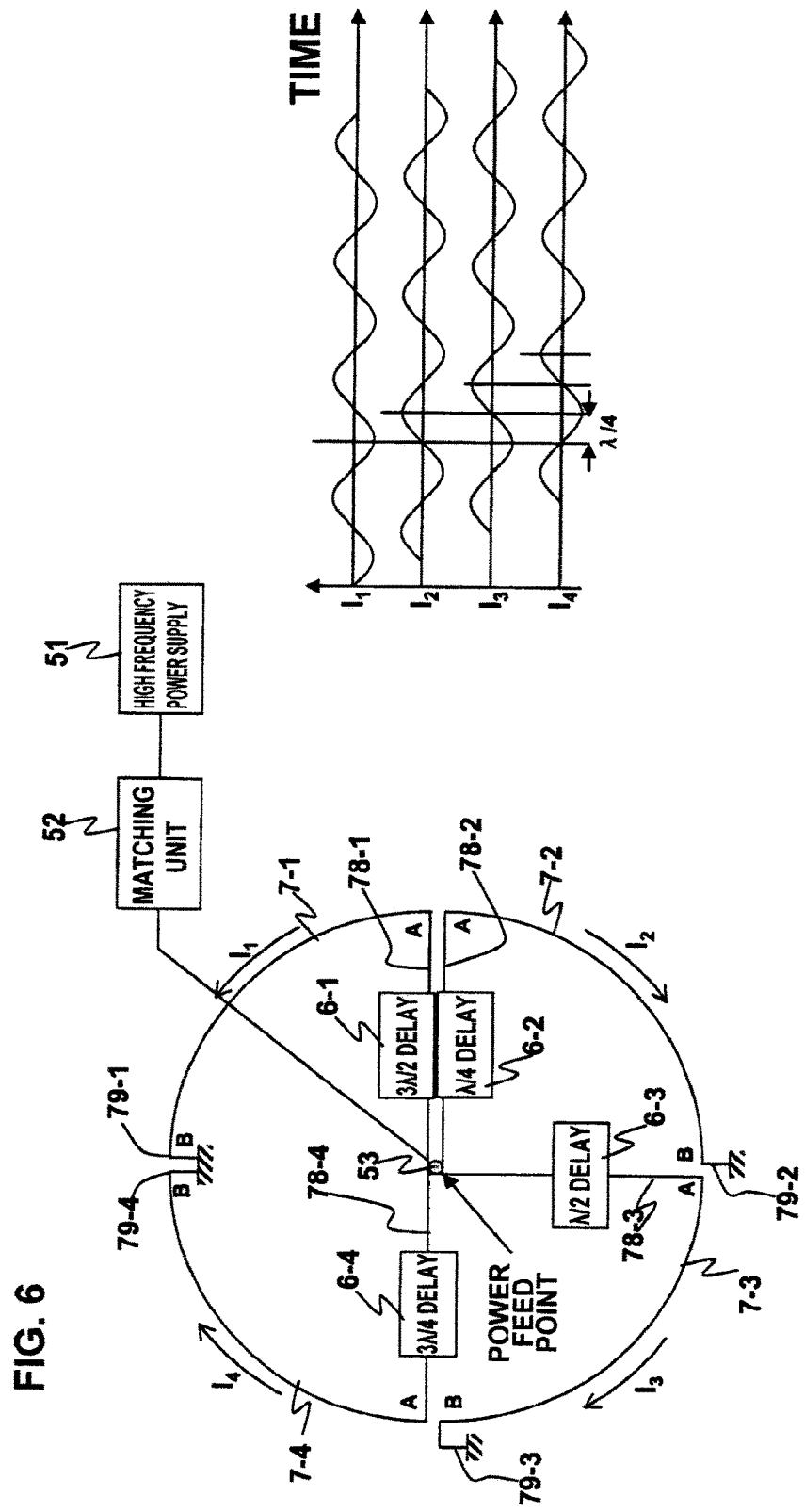
FIG. 6 is an explanatory view of the method for supplying power to high frequency induction antenna elements according to the present invention.
Figure 7:
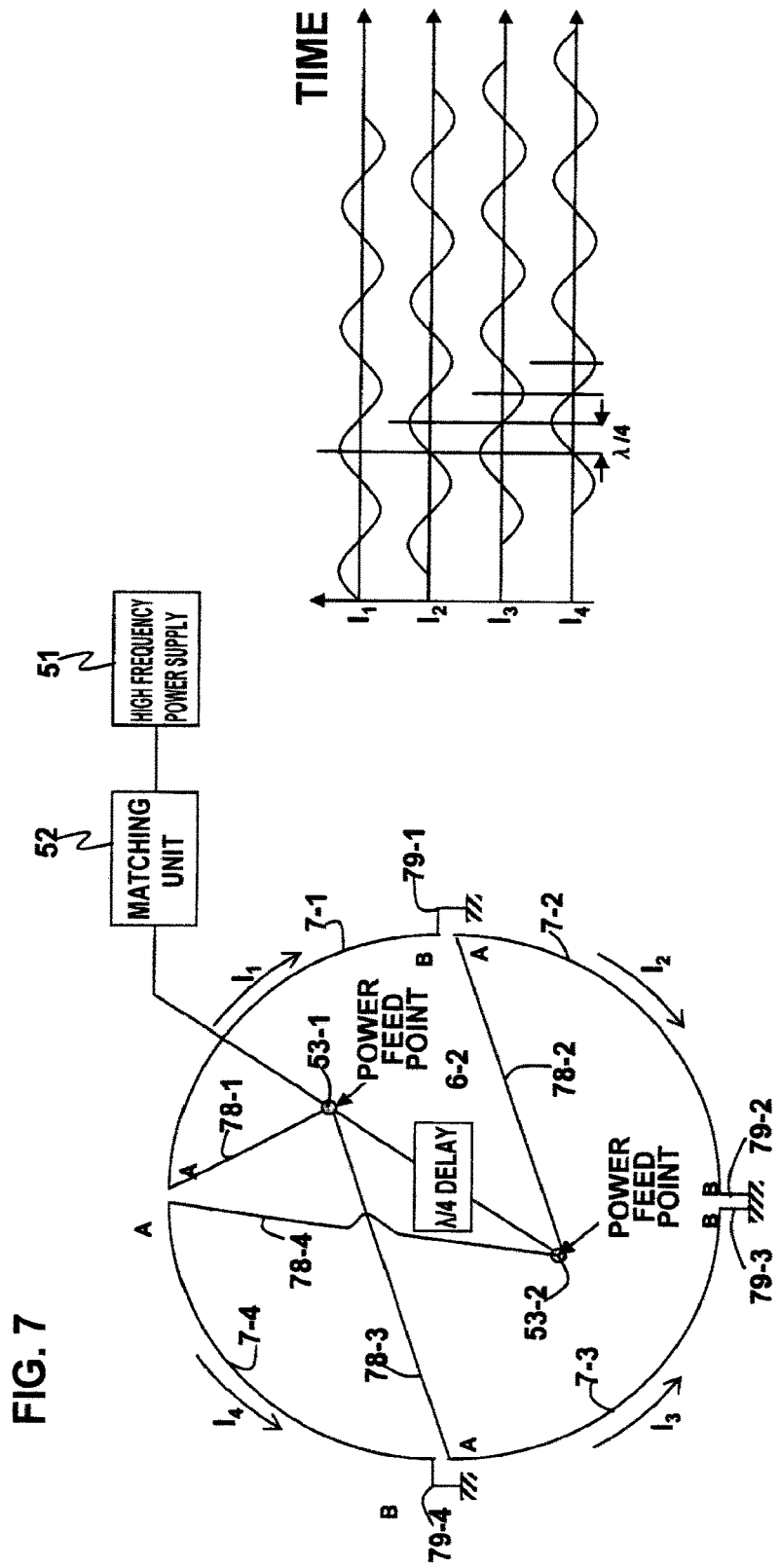
FIG. 7 is an explanatory view of the method for supplying power to high frequency induction antenna elements according to the present invention.

In FIG. 1 (FIG. 2), the power feed ends A and grounded ends B of the circular high frequency induction antenna divided into four parts are arranged point-symmetrically on one circle in the order of ABABABAB. This feature that the "power feed ends and the grounded ends arranged point-symmetrically" is not an indispensable arrangement for realizing the contents of the first necessary and sufficient conditions. The power feed ends A and the grounded ends B can be arranged arbitrarily. An example corresponding to FIG. 2 will be shown in FIG. 6. FIG. 6 illustrates an example in which the positions of the power feed end A and the grounded end B of the high frequency induction antenna element 7-1 is reversed so that the direction of the high frequency current $I_1$ is reversed. In this case, however, by reversing the phase of the high frequency current $I_1$ flowing through the high frequency induction antenna element 7-1 from the phase illustrated in FIG. 2 (for example, by delaying the phase by $3\lambda/2$), a rotating induction electric field E as shown in FIG. 5 can be created. It is recognized from this example that the reversing of positions of the power feed end A and the grounded end B is equal to reversing the phase, that is, delaying the phase by $\lambda/2$ By applying this arrangement, the arrangement of FIG. 2 can be further simplified, an example of which is shown in FIG. 7. The arrangement of FIG. 7 utilizes that ($I_1$ and $I_3$) and ($I_2$ and $I_4$) of FIG. 2 are relatively delayed by $\lambda/2$, that is, reversed. Currents of the same phase are flown to ($I_1$ and $I_3$) and ($I_2$ and $I_4$) but the power feed ends A and the grounded ends B of $I_3$ and $I_4$ are reversed. Further, since a $\lambda/4$ delay 6-2 is arranged between ($I_1$ and $I_3$) and ($I_2$ and $I_4$), an induction electric field E rotating in the same manner as FIG. 2 (illustrated in FIG. 5) can be formed. As described, many variations can be made by combining the arrangement of the high frequency induction antenna and the phase control. However, these variations are merely a matter of engineering design, and they are all examples of the present invention as long as the arrangements satisfy the contents of the first necessary and sufficient conditions mentioned earlier.

Example 3

Figure 8:
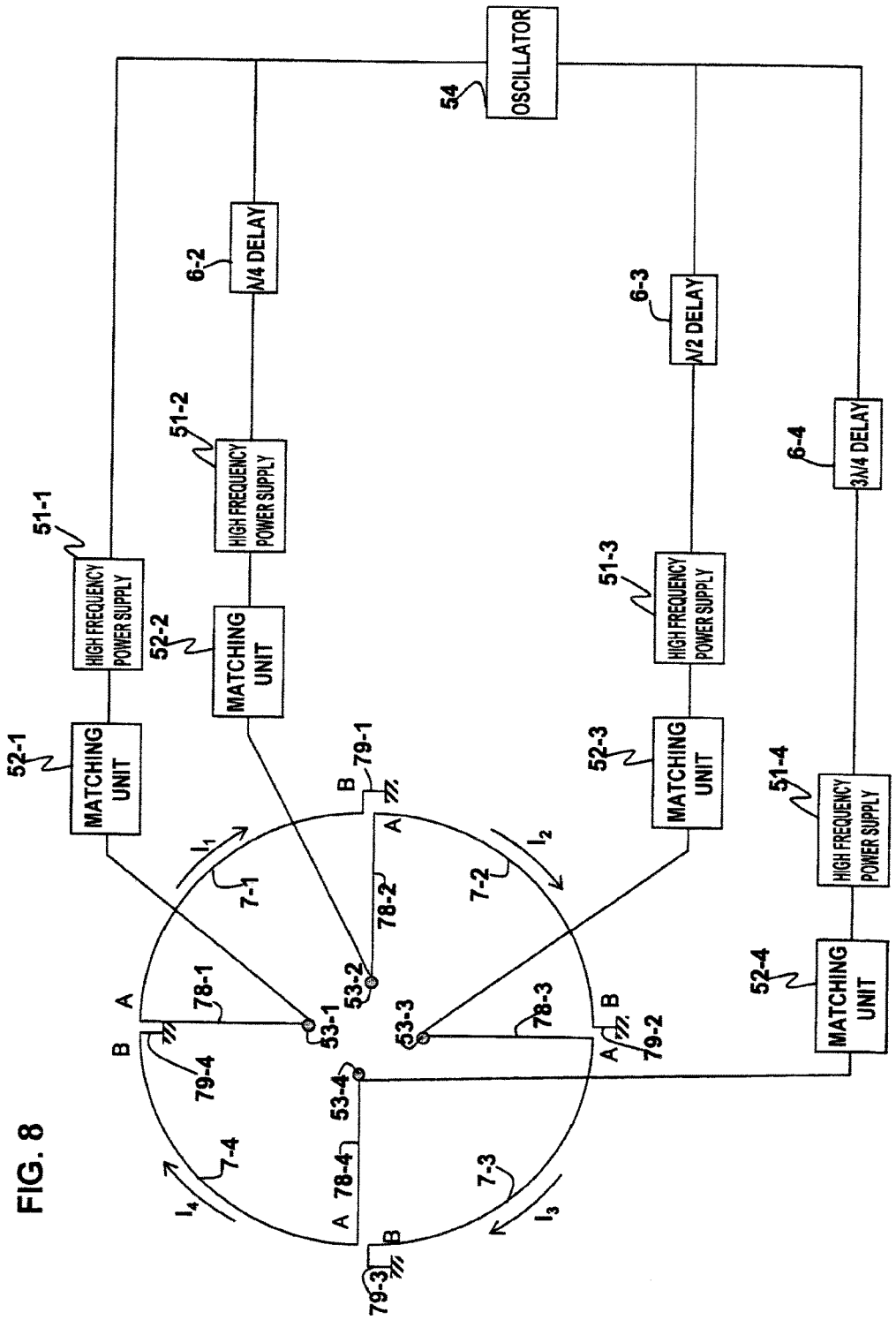
FIG. 8 is an explanatory view of the method for supplying power to high frequency induction antenna elements according to the present invention.

In FIG. 1, a phase delay circuit is disposed between the matching unit arranged in the power supply output section and the high frequency induction antenna elements 7-1 through 7-4. This arrangement that the phase delay circuit is disposed between the matching unit and the high frequency induction antenna elements 7-1 through 7-4" is not an indispensable arrangement for realizing the contents of the first necessary and sufficient conditions. It is only necessary to supply current to the high frequency induction antenna to create a rotating induction electric field E as shown in FIG. 5 in order to satisfy the contents of the first necessary and sufficient conditions. Now, FIG. 8 illustrates another example in which a rotating induction electric field E as shown in FIG. 5 is formed, similar to FIG. 2. According to the arrangement of FIG. 8, currents are flown to the high frequency induction antenna elements 7-1 through 7-4 via the same number of high frequency power supplies 51-1 through 51-4 as the number of high frequency induction antenna elements 7-1 through 7-4, but high frequency power supplies 51-1 through 51-4 and matching units 52-1 through 52-4 are respectively connected via no delay means, via a $\lambda/4$ delay means 6-2, via a E2 delay means 6-3 and via a $3\lambda/4$ delay means 6-4, to the output of a single oscillator 54, to realize necessary phase delays. By increasing the number of high frequency power supplies 51 in this manner, the number of matching units 53 are increased, but the power of each high frequency power supply can be reduced and the reliability of the high frequency power supplies can be improved. Moreover, by fine-tuning the power supplied to the respective antennas, the circumferential uniformity of antennas can be controlled.

Example 4

Figure 9:
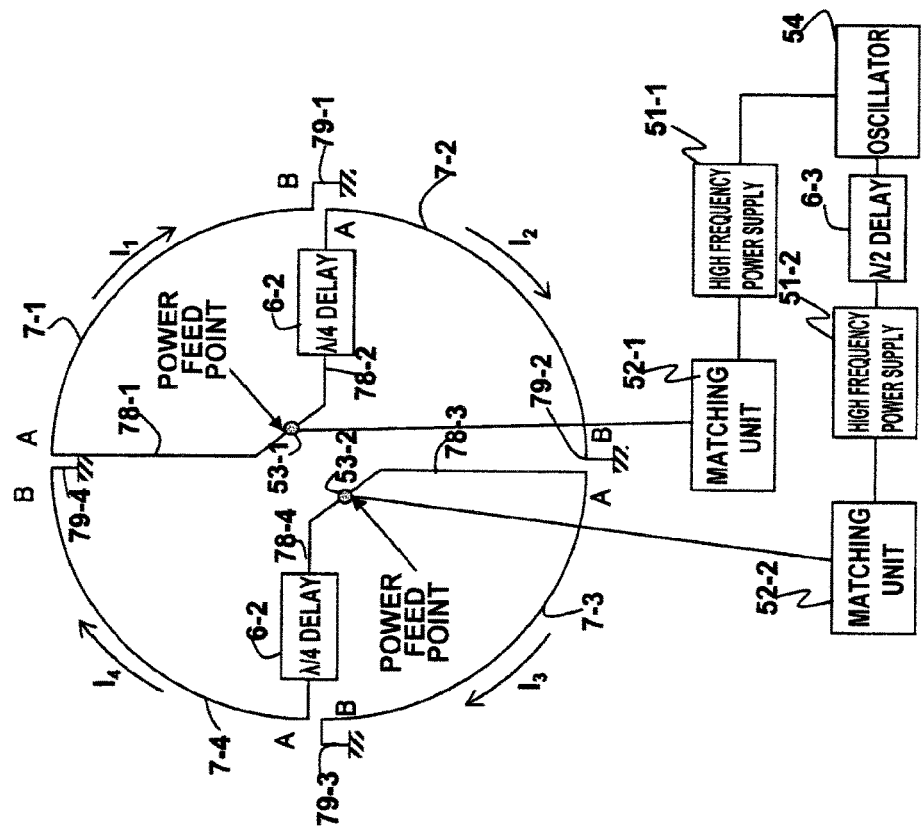
FIG. 9 is an explanatory view of the method for supplying power to high frequency induction antenna elements according to the present invention.

The variation of the arrangements of the power supply and the high frequency induction antenna are not restricted to the examples mentioned above. For example, by applying the arrangements of FIGS. 2 and 8, a rotating induction electric field E shown in FIG. 5 is formed similar to FIG. 2, but yet another arrangement can be formed. This embodiment is shown in FIG. 9. According to the embodiment of FIG. 9, a high frequency power supply 51-1 connected to an oscillator 54 and a high frequency power supply 51-2 connected to the oscillator via a A/2 delay means 6-3 output high frequencies mutually delayed by $\lambda/2$ to power feed points 53-1 and 53-2, and $\lambda/4$ delay means 6-2 are further disposed between the output of the power feed points and high frequency induction antenna elements 7-2 and 7-4 to realize necessary delays.

Example 5

Figure 10:
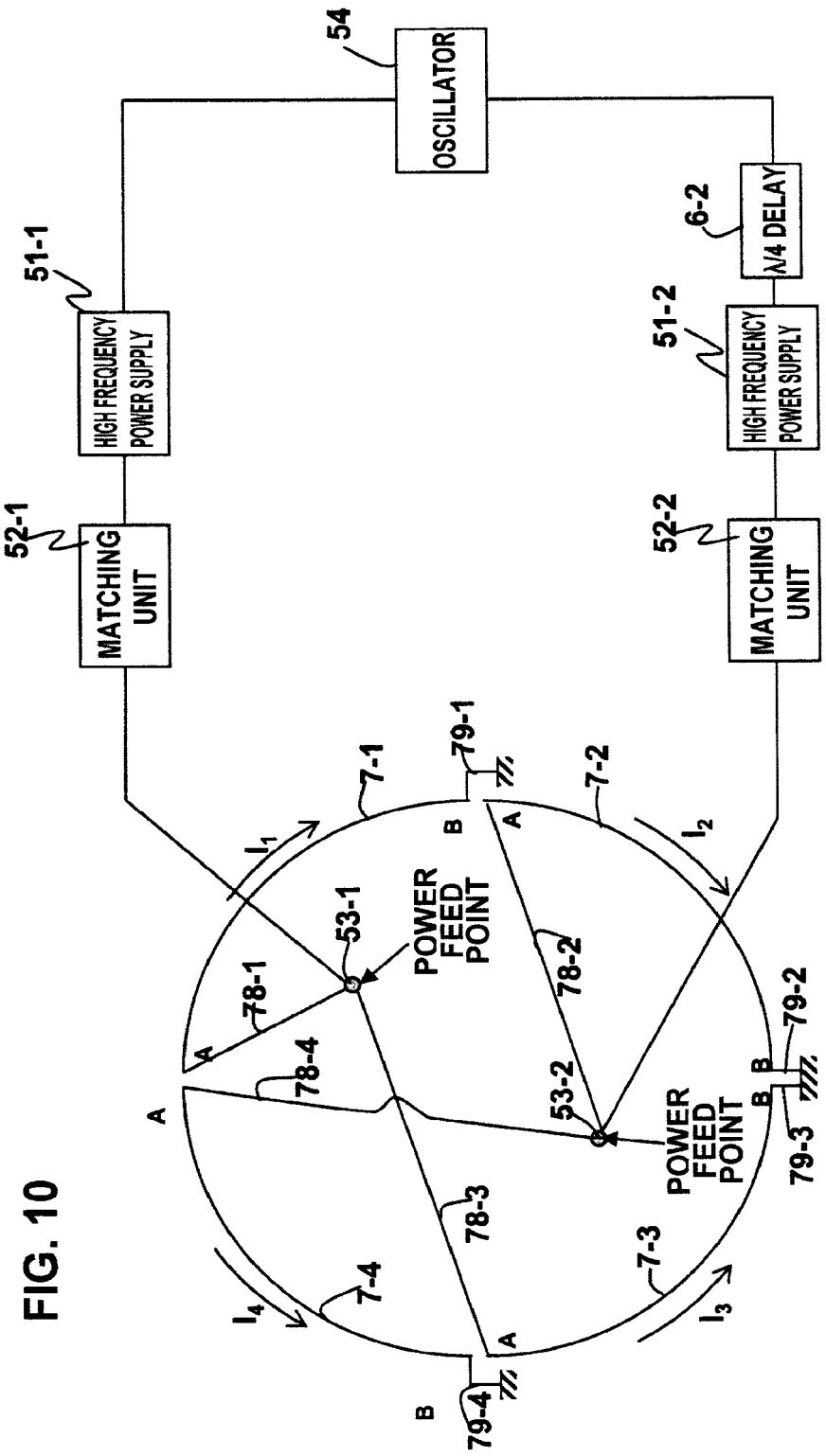
FIG. 10 is an explanatory view of the method for supplying power to high frequency induction antenna elements according to the present invention.

The following embodiment illustrated in FIG. 10 combines the embodiments of FIGS. 9 and 7. In FIG. 10, the same two high frequency power supplies 51-1 and 51-2 connected to the oscillator 54 are used, but a $\lambda/4$ delay means 6-2 is inserted between the output of the oscillator 54 and one of the high frequency power supplies 51-3 to delay the phase by $\lambda/4$, and the high frequency induction antenna elements 7-1 and 7-2 have power feed ends A and grounded ends B arranged in a similar manner as FIG. 9, while the high frequency induction antenna elements 7-3 and 7-4 have power feed ends A and grounded ends B arranged in the opposite direction (reversed) with respect to the high frequency induction antenna elements 7-1 and 7-2 in a similar manner as FIG. 7. When the reference phase of this output is set to the phase of $I_1$, $I_1$ and $I_3$ will have currents of the same phase, but since the direction of $I_3$ (power feed end A and grounded end B) is reversed compared to FIG. 2, the induction electric field E formed by $I_1$ and $I_3$ will be the same as that of FIG. 2. Further, the phases of $I_2$ and $I_4$ are delayed by $\lambda/4$ from $I_1$, and $I_2$ and $I_4$ will have currents having the same phase, but since the direction of $I_4$ (power feed end A and grounded end B) is reversed compared to FIG. 2, the induction electric field E formed by $I_2$ and $I_4$ will be the same as that of FIG. 2. As a result, the embodiment shown in FIG. 10 has a different arrangement from FIG. 2 but forms the same induction electric field E as FIG. 2.

In other words, the present embodiment provides a plasma processing apparatus comprising a vacuum reactor having a vacuum processing chamber capable of having a sample stored therein, a gas inlet for introducing processing gas into the vacuum processing chamber, a high frequency induction antenna disposed outside the vacuum processing chamber, a magnetic field coil forming a magnetic field within the vacuum processing chamber, a high frequency power supply supplying a high frequency current to the high frequency induction antenna for generating plasma, and a power supply for supplying power to the magnetic field coil, wherein high frequency current is supplied from the high frequency power supply to the high frequency induction antenna to generate plasma by the gas supplied to the vacuum processing chamber to subject the sample to plasma processing, characterized in that the high frequency induction antenna is divided into m (m being a positive even number) high frequency induction antenna elements, the divided high frequency induction antenna elements respectively arranged in tandem on a circle, so that high frequency currents delayed sequentially by $\lambda$ (wavelength of high frequency power supply)/m in advance from m/2 high frequency power supplies are sequentially flown to the tandomly arranged high frequency induction antenna elements starting from the first high frequency induction antenna element to the m/2$^{th}$ high frequency induction antenna element, and high frequency currents having the same phases as those supplied to the first to m/2$^{th}$ high frequency induction antenna elements to which the elements are opposed to are flown starting from the m/2+1th high frequency induction antenna element to the m$^{th}$ high frequency induction antenna element, wherein the high frequency induction antenna elements are arranged so that the direction of currents flowing through the high frequency induction antenna elements is reversed so as to create an electric field that rotates in a constant direction to subject the sample to plasma processing, according to which high frequency currents delayed sequentially in the clockwise direction with respect to the direction of the line of magnetic force of the magnetic field formed by supplying power to the magnetic field coil are supplied to create an electric field rotating in a specific direction to generate plasma for subjecting the sample to plasma processing.

As described, though the arrangements of FIGS. 2, 6, 7, 8, 9 and 10 differ, they all create the same induction electric field distribution E that rotates in the clockwise direction with respect to the line of magnetic force, as shown in FIG. 5. The illustrated arrangements are all variations satisfying the contents of the first necessary and sufficient conditions.

Example 6

As described earlier, when the division number n of the high frequency induction antenna is n=2, by applying a magnetic field B satisfying the contents of the second necessary and sufficient conditions, the induction electric field E formed by the high frequency induction antenna will rotate in the clockwise direction with respect to the direction of the line of magnetic force. According to this embodiment, high frequency currents having a $\lambda$/2 phase delay are supplied to two high frequency induction antenna elements. The basic arrangement of the present embodiment will be illustrated in FIG. 11. According to the arrangement of FIG. 11, the power feed end A and grounded end B of the antenna element 7-1 and the power feed end A and grounded end B of the antenna element 7-2 are arranged point-symmetrically in the circumferential direction in the order of ABAB, and one of the two outputs of the oscillator 54 is connected via a high frequency power supply 51-1 and a matching unit 52-1 to a power feed point 53-1 of the power feed end A of the high frequency induction antenna element 7-1 while the other output is connected via a $\lambda$/2 delay means 6-3, a high frequency power supply 51-2 and a matching unit 52-2 to a power feed point 53-2 of the power feed end A of the high frequency induction antenna element 7-2.

Figure 11:
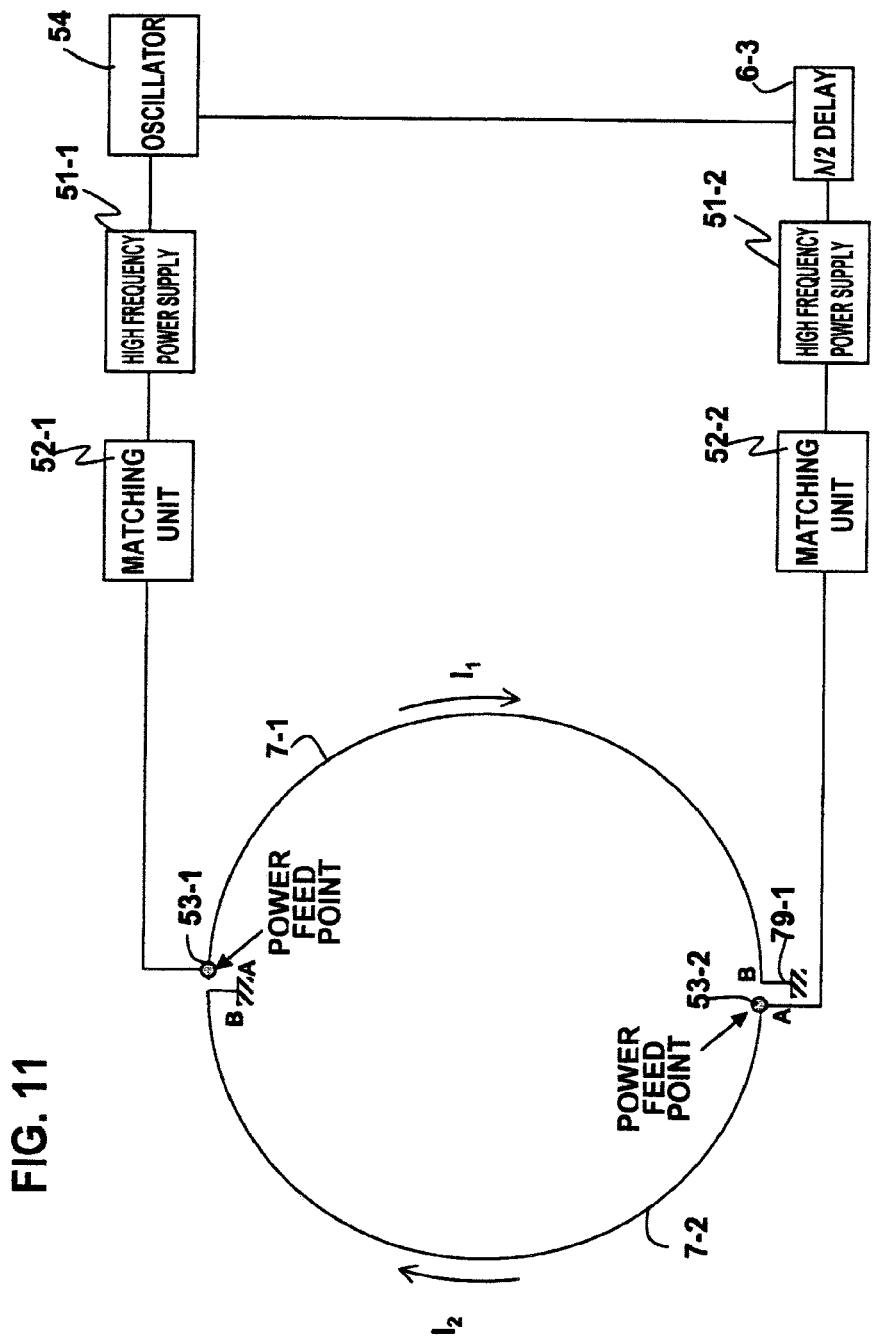
FIG. 11 is an explanatory view of the method for supplying power to high frequency induction antenna elements according to the present invention.

Accordingly, as shown in FIG. 11, the direction of currents of the respective high frequency induction antenna elements is the direction shown by arrows of $I_1$ and $I_2$. However, since currents having reversed phases ($\lambda$/2 phase delay) are supplied to the respective high frequency induction antenna elements 7-1 and 7-2, as a result, the high frequency current flown to the respective high frequency induction antenna elements 7-1 and 7-2 are either directed upwards or downwards with respect to the drawing per every half cycle of the phase. Therefore, the induction electric field E formed by FIG. 11 will have two peaks similar to FIG. 5. The electrons driven by this induction electric field E will be capable of rotating both in clockwise and counterclockwise directions according to this arrangement. However, by applying a magnetic field B satisfying the necessary and sufficient conditions (magnetic field having lines of magnetic force directed from the upper surface toward the rear surface of the paper plane of the drawing), the clockwise-rotating electrons receive high frequency energy in a resonant manner via ECR phenomenon and cause highly efficient avalanche ionization, but the counter-clockwise-rotating electrons cannot receive high frequency energy and cannot cause efficient ionization. As a result, the plasma generation is performed actively by the clockwise-rotating electrons, and only the electrons receiving high frequency energy efficiently and accelerated to high speed remain. At this time, the current components flown through the plasma are mainly composed of slow counterclockwise-rotating electrons and high speed clockwise-rotating electrons, and naturally, the current formed by the high-speed clockwise-rotating electrons becomes dominant, so that as shown in expressions (1) and (2), the induction electric field E will rotate in the clockwise direction. This phenomenon is similar to the prior art ECR plasma sources using microwaves, UHF and VHF in which ECR discharge is caused even if the electric field is not rotated in a specific direction.

Example 7

By applying the effect of FIG. 6 (or FIG. 7 or FIG. 10) to FIG. 11, it becomes possible to cause the ECR phenomenon via a simple arrangement as shown in FIG. 12. According to FIG. 12, high frequency currents having reversed phases are not supplied, but high frequency currents having the same phase are supplied to the respective high frequency induction antenna elements, and since the power feed ends A and grounded ends B of the respective high frequency induction antenna elements are the same, the directions of the currents will be reversed, according to which the effect similar to FIG. 11 can be achieved. However, if the division number n of the high frequency induction antenna is n=2, there are moments in which the currents flown to the two high frequency induction antenna elements simultaneously become zero, so exceptionally according to this arrangement, there occurs moments when the induction electric field E becomes E=0. If the division number n of the high frequency induction antenna is n≥3, currents flow to two or more high frequency induction antenna elements constantly, as can be seen clearly when drawings similar to FIG. 3 are created for each case, so that there will be no moment when the induction electric field E becomes E=0.

FIG. 1 illustrates an upper coil 81 and a lower coil 82 as two electromagnets and a yoke 83 as elements composing the magnetic field. However, it is only necessary according to the present invention to realize a magnetic field satisfying the aforementioned necessary and sufficient conditions, and neither the yoke 83 nor the two electromagnets are indispensable elements. For example, as long as the necessary and sufficient conditions are satisfied, it is possible to arrange only the upper coil 81 (or the lower coil 82). An electromagnet, a stationary magnet or a combination of electromagnet and stationary magnet can be used as the means for generating the magnetic field.

FIG. 1 illustrates a Faraday shield 9. Since the Faraday shield intrinsically functions to suppress the capacitive coupling between plasma and antenna radiating high frequency, it cannot be used in capacitively coupled ECR plasma sources. According to the present invention, the Faraday shield can be used similar to normal ICPs. However, the "Faraday shield" is not indispensable according to the present invention, since it is not related to the aforementioned necessary and sufficient conditions. However, similar to normal ICPs, the Faraday shield is effective from the viewpoint of industrial applicability. This is because the Faraday shield has a function to interrupt the capacitive coupling of antenna and plasma without influencing the induction magnetic field H (that is, the induction electric field E) irradiated from the antenna. In order to completely interrupt the capacitive coupling, the Faraday shield should be grounded. Normally in ICPs, the interruption of capacitive coupling causes the plasma ignition to be deteriorated further. According to the present invention, however, a superior plasma ignition is obtained even when the capacitive coupling is completely interrupted, since the arrangement utilizes the highly efficient ECR heating via the induction electric field E caused by inductive coupling. However, due to various reasons, it is possible to connect an electric circuit to the Faraday shield and control the high frequency voltage generated in the Faraday shield to 0 V or higher.

FIG. 1 further illustrates a gas inlet 3, a gate valve 21 and a wafer bias (bias power supply 41 and matching unit 42), but since these elements are also not related to the aforementioned necessary and sufficient conditions, they are not indispensable elements of the present invention. The gas inlet is necessary for generating plasma, but it can be arranged on the side wall of the vacuum reactor 11 or on the electrode 14 on which the wafer W is placed. Further, the gas can be injected either planarly or through pores. The arrangement of the gate valve 21 is merely illustrated with the aim to enable wafers to be carried into and out of the chamber for industrial application. Further, in industrial application of the plasma processing apparatus, the wafer bias (bias power supply 41 and matching unit 42) is not necessarily required, and is not indispensable for industrial application of the present invention.

According to the present invention, the induction electric field E formed by the high frequency induction antenna rotates in the clockwise direction with respect to the line of magnetic force of the magnetic field. The shape of the rotational plane thereof depends on the structure of the high frequency induction antenna, and are circular-shaped or oval-shaped, for example. Therefore, the induction electric field E necessarily has a center axis of rotation. In the industrial application of the present invention, such center axes exist for example in the magnetic field B, the object to be processed (such as a circular wafer or a square glass substrate), the vacuum reactor, the gas injection ports, the electrode on which the object to be processed is placed, and the evacuation port. It is not necessary according to the present invention for these center axes to correspond, and they are not indispensable components. That is because they do not relate to the aforementioned necessary and sufficient conditions. However, if the uniformity of processing of the surface of the processed object (such as the etching rate, the deposition rate or the contour thereof) becomes an issue, it is preferable that these center axes correspond.

As described, a high frequency induction magnetic field for driving currents is constantly formed in the processing chamber according to the present invention, so that the plasma ignition is improved and a high density plasma is obtained. Further, the length of the high frequency induction antenna can be controlled according to the present invention, so that the apparatus can correspond to any increase in size of the object to be processed while having the plasma uniformity in the circumferential direction improved.

The invention claimed is:

1. A plasma processing method using a plasma processing apparatus comprising:
    a vacuum processing chamber in which a sample disposed on a sample stage is plasma processed;
    a vacuum processing chamber top member provided at an upper portion of the vacuum processing chamber for sealing the vacuum processing chamber air-tightly;
    a high frequency induction antenna configured from a plurality of high frequency induction antenna elements and provided outside the vacuum processing chamber;
    a magnetic field-forming coil for forming a magnetic field within the vacuum processing chamber; and
    a high frequency power supply for supplying high frequency power to the high frequency induction antenna,
    the process comprising the step of
    arranging n high frequency induction antenna elements circumferentially on a surface substantially parallel to a surface of the sample stage on which the sample is disposed, where n-number is a natural number of at least 2, and $\lambda$ is a wavelength of the high frequency power supplied from the high frequency power supply,
    flowing the high frequency power with a phase thereof sequentially delayed by $\lambda/n$ into each of the n high frequency induction antenna elements that are arranged circumferentially on the surface,
    forming the magnetic field with the magnetic field-forming coil such that the induction electric field formed by the n high frequency induction antenna elements through which the high frequency power flow with the phase thereof sequentially delayed by $\lambda/n$ rotates in a clockwise direction with respect to a direction of a line of magnetic force of the magnetic field formed within the vacuum processing chamber, and
    coinciding a frequency of an electron cyclotron resonance generated by a mutual interaction between the electric field and the magnetic field formed by the magnetic field-forming coil with a rotational frequency of the induction electric field.

2. The plasma processing method according to claim 1, wherein the magnetic field of a magnetic flux is formed such that an outer product of the induction electric field and the magnetic flux of the magnetic field is not zero.

3. The plasma processing method according to claim 2, wherein the magnetic field is a magnetic field of a magnetic flux with the change of the magnetic field sufficiently small with respect to a single cycle of electrons in electron cyclotron motion.

4. The plasma processing method according to claim 3, wherein the magnetic field is a static magnetic field.

5. The plasma processing method according to claim 4, wherein a magnetic flux density of the magnetic field is a magnetic flux density equal to a value obtained by dividing a velocity of electrons with a radius of a Larmor motion in a direction horizontal to a plane of the induction electric field with the frequency of the electron cyclotron resonance.

6. The plasma processing method according to claim 5, wherein a Faraday shield arranged between the vacuum processing chamber top member and the high frequency induction antenna, and capacitively coupled with plasma, is grounded.

7. The plasma processing method according to claim 1, wherein, where m-number is a natural number smaller than n, in case a power feeding end and a grounded end of the m-th high frequency induction antenna element is arranged such that the high frequency power flows in a direction opposite to the rotating direction of the induction electric field, flowing the high frequency with a phase thereof delayed by $(2m-2+n)\lambda/2n$ into the m-th high frequency induction antenna element.

8. The plasma processing method according to claim 2, wherein, where m-number is a natural number smaller than n, in case a power feeding end and a grounded end of the m-th high frequency induction antenna element is arranged such that the high frequency power flows in a direction opposite to the rotating direction of the induction electric field, flowing the high frequency with a phase thereof delayed by $(2m-2+n)\lambda/2n$ into the m-th high frequency induction antenna element.

9. The plasma processing method according to claim 3, wherein, where m-number is a natural number smaller than n, in case a power feeding end and a grounded end of the m-th high frequency induction antenna element is arranged such that the high frequency power flows in a direction opposite to the rotating direction of the induction electric field, flowing the high frequency with a phase thereof delayed by $(2m-2+n)\lambda/2n$ into the m-th high frequency induction antenna element.

10. The plasma processing method according to claim 5, wherein, where m-number is a natural number smaller than n, in case a power feeding end and a grounded end of the m-th high frequency induction antenna element is arranged such that the high frequency power flows in a direction opposite to the rotating direction of the induction electric field, flowing the high frequency with a phase thereof delayed by $(2m-2+n)\lambda/2n$ into the m-th high frequency induction antenna element.

11. The plasma processing method according to claim 6, wherein, where m-number is a natural number smaller than n, in case a power feeding end and a grounded end of the m-th high frequency induction antenna element is arranged such that the high frequency power flows in a direction opposite to the rotating direction of the induction electric field, flowing the high frequency with a phase thereof delayed by $(2m-2+n)\lambda/2n$ into the m-th high frequency induction antenna element.

12. A plasma processing method using a plasma processing apparatus comprising:
   a vacuum processing chamber in which a sample disposed on a sample stage is plasma processed;
   a vacuum processing chamber top member provided at an upper portion of the vacuum processing chamber for sealing the vacuum processing chamber air-tightly;
   a high frequency induction antenna configured from a plurality of high frequency induction antenna elements and provided outside the vacuum processing chamber;
   a magnetic field-forming coil for forming a magnetic field within the vacuum processing chamber; and
   a high frequency power supply for flowing high frequency power to the high frequency induction antenna,
   the process comprising the step of
   arranging n high frequency induction antenna elements circumferentially on a surface substantially parallel to a surface of the sample stage on which the sample is disposed, where n-number is a natural number of at least 2, m-number is a natural number smaller than n, and $\lambda$ is a wavelength of the high frequency power supplied from the high frequency power supply,
   in case a power feeding end and a grounded end of the m-th high frequency induction antenna element is arranged such that the high frequency power flows in a same direction as the rotating direction of the induction electric field, flowing the high frequency with a phase thereof delayed by $(m-1)\lambda/n$ into the m-th high frequency induction antenna element, and in case the power feeding end and the grounded end of the m-th high frequency induction antenna element is arranged such that the high frequency power flows in a direction opposite to the rotating direction of the induction electric field, flowing the high frequency with a phase thereof delayed by $(2m-2+n)\lambda/2n$ into the m-th high frequency induction antenna element,
   forming the magnetic field with the magnetic field-forming coil such that the induction electric field formed by the n high frequency induction antenna elements rotates in a clockwise direction with respect to a direction of a line of magnetic force of the magnetic field formed within the vacuum processing chamber, and
   coinciding a frequency of an electron cyclotron resonance generated by a mutual interaction between the electric field and the magnetic field formed by the magnetic field-forming coil with a rotational frequency of the induction electric field.

* * * * *